United States Patent
Lewis et al.

(10) Patent No.: US 12,292,037 B2
(45) Date of Patent: *May 6, 2025

(54) COMPRESSED GAS ENERGY STORAGE SYSTEM

(71) Applicant: Hydrostor Inc., Toronto (CA)

(72) Inventors: Cameron Lewis, Toronto (CA); Andrew McGillis, Toronto (CA)

(73) Assignee: Hydrostor Inc., Toronto (CA)

( * ) Notice: Subject to any disclaimer, the term of this patent is extended or adjusted under 35 U.S.C. 154(b) by 0 days.

This patent is subject to a terminal disclaimer.

(21) Appl. No.: 17/974,363

(22) Filed: Oct. 26, 2022

(65) Prior Publication Data

US 2023/0332843 A1    Oct. 19, 2023

Related U.S. Application Data

(63) Continuation of application No. 17/422,302, filed as application No. PCT/CA2020/050032 on Jan. 13, 2020, now Pat. No. 11,519,393.

(Continued)

(51) Int. Cl.
*F03G 7/06* (2006.01)
*B65G 5/00* (2006.01)
(Continued)

(52) U.S. Cl.
CPC .................. *F03G 7/06* (2013.01); *B65G 5/00* (2013.01); *F02C 6/16* (2013.01); *F02C 7/143* (2013.01);
(Continued)

(58) Field of Classification Search
CPC ..... F03G 7/06; B65G 5/00; F02C 6/16; F02C 7/143; F03D 9/18; F15B 1/04;
(Continued)

(56) References Cited

U.S. PATENT DOCUMENTS

| 1,382,569 A | 6/1921 | Godfrey |
| 2,749,714 A | 6/1956 | Hunter |

(Continued)

FOREIGN PATENT DOCUMENTS

| AU | 2006233241 | 5/2007 |
| CA | 1073223 | 3/1980 |

(Continued)

OTHER PUBLICATIONS

Search Report dated Sep. 27, 2022 for European Application No. 20740789.1.
(Continued)

*Primary Examiner* — Hoang M Nguyen
(74) *Attorney, Agent, or Firm* — Young Basile Hanlon & MacFarlane, P.C.

(57) ABSTRACT

A compressed air energy storage system may have an accumulator and a thermal storage subsystem having a cold storage chamber for containing a supply of granular heat transfer, a hot storage chamber and at least a first mixing chamber in the gas flow path and having an interior in which the compressed gas contacts the granular heat transfer particles at a mixing pressure that is greater than the cold storage pressure and the hot storage pressure and a conveying system operable to selectably move the granular heat transfer particles from the cold storage chamber, through the first mixing chamber and into the hot storage chamber, and vice versa.

20 Claims, 12 Drawing Sheets

Related U.S. Application Data

(60) Provisional application No. 62/792,708, filed on Jan. 15, 2019.

(51) Int. Cl.

| | | |
|---|---|---|
| *F02C 6/16* | (2006.01) | |
| *F02C 7/143* | (2006.01) | |
| *F03D 9/18* | (2016.01) | |
| *F15B 1/04* | (2006.01) | |
| *F17C 1/00* | (2006.01) | |
| *F17C 5/06* | (2006.01) | |
| *F17C 13/02* | (2006.01) | |
| *F28D 20/00* | (2006.01) | |
| *H01L 21/768* | (2006.01) | |

(52) U.S. Cl.
CPC ............... *F03D 9/18* (2016.05); *F15B 1/04* (2013.01); *F17C 1/007* (2013.01); *F17C 5/06* (2013.01); *F17C 13/02* (2013.01); *F28D 20/0034* (2013.01); *F28D 20/0043* (2013.01); *F28D 20/0052* (2013.01); *H01L 21/76895* (2013.01); *F05D 2260/211* (2013.01); *F05D 2260/232* (2013.01); *F05D 2260/42* (2013.01); *Y02E 60/16* (2013.01)

(58) Field of Classification Search
CPC .. F17C 1/007; F17C 5/06; F17C 13/02; F17C 2221/031; F17C 2223/0123; F17C 2223/035; F17C 2227/0192; F17C 2270/0581; F28D 20/0034; F28D 20/0043; F28D 20/0052; F28D 19/02; F28D 20/0056; F05D 2260/42; F05D 2260/211; F05D 2260/232; F05D 2300/211; F05D 2300/5023; Y02E 60/16; Y02E 10/72; Y02E 70/30; Y02E 60/14
USPC ........................................................ 60/659
See application file for complete search history.

(56) References Cited

U.S. PATENT DOCUMENTS

| | | |
|---|---|---|
| 3,019,854 A | 2/1962 | Waitus |
| 3,643,426 A | 2/1972 | Janelid |
| 3,895,493 A | 7/1975 | Rigollot |
| 3,939,356 A | 2/1976 | Loane |
| 3,988,897 A | 11/1976 | Strub |
| 3,996,741 A | 12/1976 | Herberg |
| 4,085,971 A | 4/1978 | Jacoby |
| 4,147,204 A | 4/1979 | Pfenninger |
| 4,150,547 A | 4/1979 | Hobson |
| 4,343,569 A | 8/1982 | Schwarzenbach |
| 4,355,923 A | 10/1982 | Schwarzenbach |
| 4,391,552 A | 7/1983 | O'hara |
| 4,392,354 A | 7/1983 | Schwarzenbach |
| 4,399,656 A | 8/1983 | Laing |
| 4,403,477 A | 9/1983 | Schwarzenbach |
| 4,450,547 A | 5/1984 | Nakamura et al. |
| 4,454,721 A | 6/1984 | Hurlimann |
| 4,523,432 A | 6/1985 | Frutschi |
| 4,538,414 A | 9/1985 | Saleh |
| 4,727,930 A | 3/1988 | Bruckner |
| 5,634,340 A | 6/1997 | Grennan |
| 6,167,951 B1 | 1/2001 | Couch |
| 6,185,841 B1 | 2/2001 | Conochie |
| 6,467,535 B1 | 10/2002 | Shembekar |
| 6,637,977 B2 | 10/2003 | Hayashi |
| 6,739,522 B2 | 5/2004 | Laumen |
| 7,663,255 B2 | 2/2010 | Kim et al. |
| 7,755,212 B2 | 7/2010 | Enis et al. |
| 8,136,354 B2 | 3/2012 | Havel |
| 8,277,145 B2 | 10/2012 | Dickinson, III et al. |
| 8,739,522 B2 | 6/2014 | Anikhindi |
| 9,045,209 B2 | 6/2015 | Zeren et al. |
| 9,322,296 B2 | 4/2016 | Hugo et al. |
| 9,383,105 B2 | 7/2016 | Naeve |
| 9,404,512 B2 | 8/2016 | Ulrich |
| 9,422,948 B2 | 8/2016 | Kim et al. |
| 9,433,910 B2 | 9/2016 | Wyttenbach |
| 9,739,536 B2 | 8/2017 | Erben |
| 9,777,965 B2 | 10/2017 | Chordia |
| 9,803,603 B2 | 10/2017 | Ganser |
| 9,803,803 B1 | 10/2017 | Adams |
| 10,859,207 B2 | 12/2020 | Lewis et al. |
| 11,274,792 B2 | 3/2022 | Stradiotto |
| 11,519,393 B2 * | 12/2022 | Lewis ............... F02C 6/16 |
| 11,591,957 B2 | 2/2023 | Howitt |
| 11,644,150 B2 | 5/2023 | Stradiotto |
| 11,767,950 B2 | 9/2023 | Lewis et al. |
| 11,821,584 B2 | 11/2023 | Stradiotto |
| 11,835,023 B2 | 12/2023 | Young |
| 2003/0021631 A1 | 1/2003 | Hayashi |
| 2005/0004416 A1 | 1/2005 | Okutsu |
| 2008/0000233 A1 | 1/2008 | Althaus |
| 2010/0218500 A1 | 9/2010 | Ruer |
| 2010/0248500 A1 | 9/2010 | Ting et al. |
| 2011/0094212 A1 | 4/2011 | Ast |
| 2011/0094229 A1 | 4/2011 | Freund |
| 2011/0094231 A1 | 4/2011 | Freund |
| 2011/0094242 A1 | 4/2011 | Koerner |
| 2011/0100010 A1 | 5/2011 | Freund et al. |
| 2011/0296823 A1 | 12/2011 | McBride |
| 2012/0057998 A1 | 3/2012 | Ingersoll |
| 2012/0067047 A1 | 3/2012 | Peterson |
| 2012/0102954 A1 | 5/2012 | Ingersoll |
| 2012/0174569 A1 | 7/2012 | Ingersoll |
| 2012/0297776 A1 | 11/2012 | Bollinger |
| 2013/0061591 A1 | 3/2013 | Bove |
| 2014/0013735 A1 | 1/2014 | Mcbride |
| 2014/0020369 A1 | 1/2014 | Guidati |
| 2015/0000248 A1 | 1/2015 | Del Omo |
| 2015/0015210 A1 | 1/2015 | Bradwell |
| 2015/0091301 A1 | 4/2015 | Littmann |
| 2015/0114611 A1 | 4/2015 | Morris |
| 2015/0125210 A1 | 5/2015 | Ingersoll |
| 2015/0267612 A1 | 9/2015 | Bannari |
| 2016/0032783 A1 | 2/2016 | Howes |
| 2016/0231072 A1 | 8/2016 | Pohlman |
| 2017/0013867 A1 | 1/2017 | Kelleher et al. |
| 2017/0138674 A1 | 5/2017 | Pourima |
| 2017/0159503 A1 | 6/2017 | Plais |
| 2017/0350658 A1 | 12/2017 | Kerth |
| 2018/0017213 A1 | 1/2018 | Deleau |
| 2018/0094581 A1 | 4/2018 | Teixeira |
| 2018/0179916 A1 | 6/2018 | Larochelle |
| 2018/0313270 A1 | 11/2018 | Jones |
| 2019/0011593 A1 | 1/2019 | Marsala et al. |
| 2019/0346082 A1 | 11/2019 | Lewis |
| 2020/0103178 A1 | 4/2020 | Gerstler |
| 2021/0207586 A1 | 7/2021 | Lewis |
| 2021/0207771 A1 | 7/2021 | Lewis |
| 2021/0388809 A1 | 12/2021 | Young |
| 2021/0388810 A1 | 12/2021 | Young |
| 2022/0090585 A1 | 3/2022 | Lewis |
| 2022/0196341 A1 | 6/2022 | Young |
| 2023/0110494 A1 | 4/2023 | Cameron |
| 2023/0332843 A1 | 10/2023 | Lewis et al. |
| 2024/0035621 A1 | 2/2024 | Stradiotto |
| 2024/0191725 A1 | 6/2024 | Young |
| 2024/0218885 A1 | 7/2024 | Young |

FOREIGN PATENT DOCUMENTS

| | | |
|---|---|---|
| CA | 1160063 A | 1/1984 |
| CA | 1179511 | 12/1984 |
| CA | 1281611 C | 3/1991 |
| CA | 2785004 A1 | 6/2011 |
| CA | 2807502 A1 | 2/2012 |
| CA | 2824798 A1 | 7/2012 |
| CA | 2982255 A1 | 10/2016 |
| CA | 3052080 A1 | 8/2018 |
| CA | 3055620 A1 | 9/2018 |

(56) References Cited

FOREIGN PATENT DOCUMENTS

| | | |
|---|---|---|
| CN | 103206349 A | 7/2013 |
| CN | 205422944 U | 8/2016 |
| CN | 107842392 A | 3/2018 |
| CN | 207847852 U | 9/2018 |
| DE | 2636417 A1 | 2/1978 |
| DE | 102010055750 A1 | 6/2012 |
| EP | 0566868 A1 | 2/1996 |
| EP | 1443177 A1 | 8/2004 |
| EP | 2450549 A2 | 5/2012 |
| EP | 2549090 A1 | 1/2013 |
| EP | 2559881 A2 | 2/2013 |
| EP | 2530283 B1 | 9/2013 |
| EP | 2832666 A1 | 4/2015 |
| EP | 2447501 A2 | 5/2021 |
| FR | 2706432 A1 | 12/1994 |
| FR | 3019854 A1 | 10/2015 |
| FR | 3023321 A1 | 1/2016 |
| GB | 1213112 A | 11/1970 |
| GB | 2013318 A | 8/1979 |
| GB | 2528449 A | 1/2016 |
| JP | S54133211 A | 10/1979 |
| JP | 55-115498 | 8/1980 |
| JP | S5797997 A | 6/1982 |
| JP | 10275730 A | 3/1990 |
| JP | H04121424 A | 4/1992 |
| JP | H05214888 A | 8/1993 |
| JP | H07330079 A | 12/1995 |
| JP | H09154244 A | 6/1997 |
| JP | 2636417 B2 | 7/1997 |
| JP | H09287156 A | 11/1997 |
| JP | H1121926 | 1/1999 |
| JP | 2005009609 A | 1/2005 |
| JP | 2013509528 A | 3/2013 |
| JP | 2016211515 A | 12/2016 |
| WO | 1998039613 | 9/1998 |
| WO | 2011053411 A1 | 5/2011 |
| WO | 2012097216 | 7/2012 |
| WO | 2013131202 A1 | 9/2013 |
| WO | 2014183894 A1 | 11/2014 |
| WO | 2015/019096 A1 | 2/2015 |
| WO | 2015015184 A2 | 2/2015 |
| WO | 2015159278 | 10/2015 |
| WO | 2016012764 A1 | 1/2016 |
| WO | 2016131502 A1 | 8/2016 |
| WO | 2016185906 A1 | 11/2016 |
| WO | 2017093768 A1 | 6/2017 |
| WO | 2017/140481 A1 | 8/2017 |
| WO | 2017194253 A1 | 11/2017 |
| WO | 2017198397 A1 | 11/2017 |
| WO | 2018141057 A1 | 8/2018 |
| WO | 2018161172 | 9/2018 |
| WO | 2019/011593 A1 | 1/2019 |
| WO | 2019218084 | 11/2019 |
| WO | 2019218085 | 11/2019 |
| WO | 2020146938 | 7/2020 |
| WO | 2020160635 | 8/2020 |
| WO | 2020160670 | 8/2020 |
| WO | 2020160681 | 8/2020 |
| WO | 2020172748 | 9/2020 |
| WO | 2022213179 | 10/2022 |
| WO | 2022226656 | 11/2022 |
| WO | 2024130447 | 6/2024 |

OTHER PUBLICATIONS

European Search Report dated Nov. 9, 2022 for European Application No. 19914559.0, 8 pgs.
International Search Report and Written Opinion received for PCT Serial No. PCT/CA2020/050032 on Mar. 27, 2020, 10 pgs.
Office Action dated Jan. 5, 2022 for Japanese Application No. 2019-562449.
Wang, J. et al., Overview of Compressed Air Energy Storage and Technology Development; Energies; 2017; 10, 991; 22 pages; http://wrap.warwick.ac.uk/91858/7/WRAP-overview-compressed-air-energy-storage-technology-Jevelopment-Wang-2017.pdf.
RWE Power AG: Essen/Koln, "ADELE—Adiabatic Compressed-Air Energy Storage for Electricity Supply", Feb. 3, 2011; http://www.rwe.com/web/cms/mediablob/en/391748/data/235554/1/rwe-power-ag/press/company/Brochure-ADELE.pdf.
Sequi, P.M. "Modelling of the Dynamic Behavior of an Advanced Adiabatic Compressed Air Energy Storage (AA-CAES)", Nov. 2018; 154 pages with Translation; http://oa.upm.es/53802/1/TFG_PABLO_MARTIN_SEQUI.pdf.
Office Action (Non-Final Rejection) dated Apr. 15, 2024 for U.S. Appl. No. 18/237,021 (pp. 1-11).
Office Action (Non-Final Rejection) dated Jun. 20, 2024 for U.S. Appl. No. 18/377,933 (pp. 1-9).
Office Action dated May 3, 2024 for Australian Application 2019268820.
Supplemental Search Report issued for European Application No. 19803698.0, mailed Feb. 8, 2022.
Examination Report issued for European Application No. 19803698.0, mailed Apr. 26, 2024.
European Search Report received for European Application No. 18747216.2 on Apr. 7, 2021, 16 pgs.
Office Action (Notice of Allowance and Fees Due (PTOL-85)) dated Apr. 9, 2024 for U.S. Appl. No. 17/055,949 (pp. 1-8).
Office Action (Notice of Allowance and Fees Due (PTOL-85)) dated May 14, 2024 for U.S. Appl. No. 17/055,948 (pp. 1-10).
Office Action (Notice of Allowance and Fees Due (PTOL-85)) dated May 16, 2024 for U.S. Appl. No. 17/055,948 (pp. 1-2).
International Search Report and Written Opiniont Received for PCT/CA2019/050680, mailed Jul. 8, 2019.
Laubscher, Hendrik et al. "Developing a cost effective rock bed thermal energy storage system: Design and modelling", article published Jun. 27, 2017.
European Search Reported issued for European Appliation No. 20753221.9, mailed Sep. 29, 2022.
International Search Report and Written Opinion received for PCT Serial No. PCT/CA2019/050700 on Sep. 27, 2019, 9 pgs.
Office Action (Final Rejection) dated Jan. 25, 2024 for U.S. Appl. No. 17/429,146 (pp. 1-18).
International Search Report for PCT/CA2020/050169, mailed Apr. 15, 2020.
Office Action (Non-final) issued for U.S. Appl. No. 17/429,155, mailed Dec. 12, 2023.
"Shell and Tube Heat Exchangers" article available online from Thermopedia as of Feb. 8, 2011, available at https://www.thermopedia.com/content/1121/.
"Coil-Wound Heat Exchangers (CWHEs)" publication from Linde Engineering, copyright 2018-2019, available online at https://assets.linde.com/-/media/global/engineering/engineering/home/products-and-services/plant-components/plate-fin-heat-exchangers/coil-wound-heat-exchanger-2019.pdf.
Jorio, Luigi, "A huge battery made of air" online article published Aug. 10, 2016, available at https://www.swissinfo.ch/eng/sci-tech/energy-in-the-mountains_a-huge-battery-made-of-air/42362400.
International Search Report and Written Opinion received for PCT/CA2020/050153 on Apr. 24, 2020, 11 pgs.
Office Action (Final Rejection) dated Apr. 5, 2024 for U.S. Appl. No. 17/422,616 (pp. 1-9).
International Search Report and Written Opinion received for PCT Serial No. PCT/CA2020/050246 dated May 27, 2020, 10 pgs.
International Search Report for PCT/CA2022/050656, mailed Jul. 21, 2022.
International Preliminary Report on Patentability for PCT/CA2022/050656, mailed Oct. 24, 2023.
International Preliminary Report on Patentability issued on PCT/CA2022/050503 on Oct. 10, 2023.
International Search Report and Written Opinion for PCT/CA2023/051761 mailed Feb. 19, 2024.
International Preliminary Report on Patentability issued on PCT/CA2018/050112 mailed May 21, 2019 (26 pages).
International Preliminary Report on Patentability issued on PCT/CA2018/050282 mailed Sep. 10, 2019.
International Preliminary Report on Patentability issued on PCT/CA2019/050679 mailed Jul. 10, 2019.

(56) References Cited

OTHER PUBLICATIONS

International Preliminary Report on Patentability issued on PCT/CA2019/050680 mailed on Nov. 17, 2020.

* cited by examiner

COMPRESSED GAS ENERGY STORAGE SYSTEM

CROSS-REFERENCE TO RELATED APPLICATION

This application is a continuation of U.S. application Ser. No. 17/722,302, filed Jul. 12, 2021, which is a national stage entry PCT application no. PCT/CA2020/050032 filed Jan. 13, 2020, which itself claims priority to U.S. Provisional Patent Application Ser. No. 62/792,708 filed Jan. 15, 2019, and entitled A Compressed Gas Energy Storage System, the entirety of these applications being incorporated by reference herein.

FIELD

The present disclosure relates generally to compressed gas energy storage, and more particularly to a compressed gas energy storage system such as, for example, one including a hydrostatically compensated, compressed air energy storage accumulator located underground, the use thereof.

Introduction

Electricity storage is highly sought after, in view of the cost disparities incurred when consuming electrical energy from a power grid during peak usage periods, as compared to low usage periods. The addition of renewable energy sources, being inherently of a discontinuous or intermittent supply nature, increases the demand for affordable electrical energy storage worldwide.

Thus there exists a need for effectively storing the electrical energy produced at a power grid or a renewable source during a non-peak period and providing it to the grid upon demand. Additionally, to the extent that the infrastructural preparation costs and the environmental impact from implementing such infrastructure are minimized, the utility and desirability of a given solution is enhanced.

Furthermore, as grids transform and operators look to storage in addition to renewables to provide power and remove traditional forms of generation that also provide grid stability, such as voltage support, a storage method that offers inertia based synchronous storage is highly desirable.

SUMMARY OF THE INVENTION

This summary is intended to introduce the reader to the more detailed description that follows and not to limit or define any claimed or as yet unclaimed invention. One or more inventions may reside in any combination or sub-combination of the elements or process steps disclosed in any part of this document including its claims and figures.

In accordance with one broad aspect of the teachings described herein, which may be used alone or in combination with any other aspects, a compressed gas energy storage system may include an accumulator having a primary opening, an upper wall, a lower wall and an accumulator interior at least partially bounded the upper wall and lower wall. The accumulator may be configured for containing a layer of compressed gas atop a layer of liquid when in use. A gas compressor/expander subsystem may be spaced apart from the accumulator and a gas conduit may have an upper end in communication with the gas compressor/expander subsystem and a lower end in communication with accumulator interior for conveying compressed gas between the compressed gas layer in the accumulator and the compressor/expander subsystem. A shaft may have a lower end adjacent the primary opening, an upper end spaced apart from the lower end, and a shaft sidewall extending upwardly from the lower end to the upper end and at least partially bounding a shaft interior for containing a quantity of a liquid. The shaft may be fluidly connectable to a liquid source/sink via a liquid supply conduit. A thermal storage subsystem may be provided in fluid communication between the gas compressor/expander subsystem and the accumulator, whereby thermal energy may be extracted from the compressed gas exiting the gas compressor/expander subsystem at an exit temperature during a charging phase/process and stored in the thermal storage subsystem and the temperature of the gas exiting the thermal storage subsystem may be reduced to a storage temperature that is less than the exit temperature. During an expansion process gas exiting the accumulator may pass through the thermal storage subsystem again before reaching the gas compressor/expander subsystem, whereby at least a portion of the thermal energy that was extracted from the compressed gas entering the accumulator may be re-introduced into the gas exiting the accumulator to raise the temperature of the gas from the storage temperature to a higher, exit temperature prior to expansion. This may help provide a desired system efficiency.

A partition may be positioned at the lower end of the shaft and covering the primary opening and separating the accumulator interior from the shaft interior, the partition having an outer surface in communication with the shaft interior and an opposing inner surface in communication with the accumulator interior. At least one of the layer of compressed gas and the layer of liquid may bear against and may exert an internal accumulator force on the inner surface of the partition and the quantity of liquid within the shaft bears against and exerts an external counter force on the outer surface of the partition, whereby a net force acting on the partition while the compressed gas energy storage system is in use is a difference between the accumulator force and the counter force and may be less than the accumulator force.

There are several possibilities for the thermal storage media, including liquids or solids, such as granular particles like sand, gravel, metal particles, or brick particles. Similarly, there are many possible configurations for the heat exchange of thermal energy between the thermal storage media and the compressed gas, including both direct and indirect heat exchangers. The choice of heat exchanger style may be influenced by the choice of thermal storage media.

In some embodiments, the preferred thermal storage media may be a solid material, rather than a liquid or gas, and may optionally include granular particles (such as gravel, sand, rocks, metal, fire brick, silica and the like). Such granular particles may be provided in direct contact with the gas flowing through the gas flow path, which may help enhance heat transfer between the gas and the granular particles. When operated within its intended operating parameters, the use of granular particles within the thermal storage subsystem may help facilitate such direct contact heat exchange while helping to reduce the chances of evaporation of the thermal storage media and/or mixing of the thermal storage media into the flowing gas stream as could be concerns if a liquid or gas thermal storage media were used in a direct contact arrangement.

Because the granular particles are unlikely to change phase/state when heated by the gas flow stream or when stored in a heated state, as compared to heating a liquid thermal storage media such as water, the use of granular thermal storage particles may help facilitate operating a storage reservoir and other aspects of the thermal storage subsystem at generally atmospheric pressure (e.g. without the need to pressurize the storage reservoir to help inhibit boiling of a liquid thermal storage media that has been heated to a temperature that is above its atmospheric pressure boiling point).

Optionally, the gas conduit conveys compressed gas between the compressed gas layer and the gas compressor/expander subsystem via a thermal storage subsystem, and portions of the thermal storage subsystem may form part of the gas flow path between the compressor/expander subsystem and the accumulator.

In accordance with another broad aspect of the teachings described herein, that may be used alone or in combination with other aspects, a compressed air energy storage system may include an accumulator disposed underground and having an interior configured to contain compressed gas at a storage pressure that is between about may be at least between about 10 and 100 bar, and may be between about 30 and 80 bar, and between about 50 and 60 bar when in use. A gas compressor/expander subsystem may include at least a first compression stage having a first gas inlet and a gas outlet in fluid communication with the accumulator interior via a gas flow path for conveying compressed gas at the storage pressure to the accumulator when in a charging mode and from the accumulator when in a discharging mode. A thermal storage subsystem may include a cold storage chamber for containing a supply of granular heat transfer particles at a cold temperature and cold storage pressure, and a hot storage chamber for containing the supply of granular heat transfer particles at a hot temperature and hot storage pressure. At least a first mixing chamber may be provided in the gas flow path and may have an interior in which the compressed gas contacts the granular heat transfer particles at a mixing pressure that is greater than the cold storage pressure and the hot storage pressure. A conveying system may be operable to selectably move the granular heat transfer particles from the cold storage chamber, through the first mixing chamber and into the hot storage chamber, and vice versa.

When the compressed air energy storage system is in the charging mode: i) granular heat transfer particles may be conveyed from the cold storage chamber into the first mixing chamber, ii) thermal energy may be transferred to the granular heat transfer particles within the mixing chamber from the compressed gas stream being conveyed into the accumulator via the first mixing chamber thereby heating the granular heat transfer particles and cooling the compressed gas, and iii) the heated granular heat transfer particles may be conveyed from the first mixing chamber to the hot storage chamber for storage. When the compressed gas energy storage system is in the discharging mode i) granular heat transfer particles may be conveyed from the hot storage chamber into the first mixing chamber, ii) thermal energy may be transferred from the granular heat transfer particles within the mixing chamber to the compressed gas stream being conveyed out of the accumulator via the first mixing chamber thereby cooling the granular heat transfer particles and heating the compressed gas and iii) the cooled granular heat transfer particles may be conveyed from the first mixing chamber to the cold storage chamber for storage.

The mixing pressure may be substantially the same as the storage pressure (and may be the same as the accumulator and compressor outlet).

The hot storage chamber may be spaced apart from and fluidly isolated from the cold storage chamber.

The first mixing chamber may have: i) a gas inlet by which compressed gas can enter the first mixing chamber, ii) a gas outlet by which compressed gas can exit the first mixing chamber, iii) a particle inlet by which the granular heat transfer particles can enter the first mixing chamber; and iv) a particle outlet by which the granular heat transfer particles can exit the first mixing chamber.

The conveying system may include an inlet airlock at the particle inlet that is operable to permit passage of the granular heat transfer particles at the cold or hot storage temperature into the mixing chamber interior while maintaining the interior at the mixing pressure with minimal loss of air.

The conveying system may include an outlet airlock at the particle outlet that is operable to permit passage of the granular heat transfer particles at the cold or hot storage temperature out of the mixing chamber interior while maintaining the interior at the mixing pressure with minimal loss of air.

The granular heat transfer particles may include at least one of sand, silica, gravel, rocks and the like. Alternatively, the granular heat transfer particles may be composed of concrete, metal, ceramics and the like. These particles may be purpose built or may be reused/recycled from a previous purpose.

The granular heat transfer particles may be conveyed in a generally continuous flow manner between the cold storage tank, mixing chamber, and hot storage tank when the system is the charging or discharging mode, or optionally may be conveyed in a generally batch process.

The mixing chamber may be configured in a counter-flow arrangement in which the granular heat transfer particles move from the particle inlet to the particle outlet in a first flow direction and the compressed gas moves from the gas inlet to the gas outlet in a generally opposing, second flow direction.

The particle inlet may be disposed toward an upper end of the mixing chamber and the particle outlet may be disposed toward a lower end of the mixing chamber whereby the granular heat transfer particles fall generally downwardly through the interior of the mixing chamber via gravity in the charging mode and the compressed gas flows upwardly through the mixing chamber in the charging mode.

The particle inlet may be disposed toward an upper end of the mixing chamber and the particle outlet may be disposed toward a lower end of the mixing chamber whereby the granular heat transfer particles fall generally downwardly through the interior of the mixing chamber via gravity in the discharging mode and the compressed gas flows upwardly through the mixing chamber in the discharging mode The particle inlet may include a cold inlet port in communication with the cold storage chamber and a separate and a hot inlet port in communication with the hot storage chamber. The particle outlet may include a cold outlet port out in communication with the cold storage chamber and a separate and a hot outlet port in communication with the hot storage chamber.

The mixing pressure may be greater than atmospheric pressure and may be equal to or less than the storage pressure.

The hot storage chamber may be at a lower pressure than the mixing chamber.

The hot storage pressure may be less than about 10% of the storage pressure.

The hot storage chamber may be at substantially atmospheric pressure.

The cold storage chamber may be at a lower pressure than the mixing chamber.

The cold storage pressure may be less than about 10% of the storage pressure.

The cold storage chamber may be at substantially atmospheric pressure.

The cold storage chamber may be at substantially the same pressure as the hot storage chamber.

The capacity of the cold storage chamber may be greater than a capacity of the mixing chamber.

The capacity of the hot storage chamber may be greater than a capacity of the mixing chamber.

In accordance with another broad aspect of the teachings described herein, that may be used alone or in combination with other aspects, a method of temporarily storing thermal energy via a thermal storage subsystem in a compressed air energy storage system comprising an accumulator disposed underground and having an interior configured to contain compressed gas at a storage pressure that may be between about 10 and 100 bar, and may be between about 30 and 80 bar, and between about 50 and 60 bar when in use. A gas compressor/expander subsystem may include at least a first compression stage having a first gas inlet and a gas outlet in fluid communication with the accumulator interior via a gas flow path for conveying compressed gas to the accumulator when in a charging mode and from the accumulator when in a discharging mode. The method may include, during the charging mode: i) conveying a quantity of granular heat transfer particles from a cold storage chamber into an interior of a mixing chamber; ii) contacting the granular heat transfer particles in the interior of a mixing chamber with the compressed gas traveling from the gas compressor/expander subsystem into the accumulator, thereby transferring thermal energy from the compressed gas to the granular heat transfer particles, warming the granular heat transfer particles and cooling the compressed gas, and iii) conveying warmed granular heat transfer particles from the interior of the mixing chamber into a hot storage chamber, iv) conveying a second portion of cold granular heat transfer particles from a cold storage chamber into the interior of the mixing chamber; v) contacting the second portion of cold granular heat transfer particles in the interior with the compressed gas traveling from the gas compressor/expander subsystem into the accumulator, thereby transferring thermal energy from the compressed gas to the second portion of cold granular heat transfer particles, providing a second portion of warmed granular heat transfer particles and cooling the compressed gas; and vi) conveying the second portion of warmed granular heat transfer particles from the interior of the mixing chamber into a hot storage chamber.

The first portion of cold granular heat transfer particles may include only a portion of the total quantity of cold granular heat transfer particles contained in the cold storage chamber.

The first portion of cold granular heat transfer particles may fall downwardly through the interior of the mixing chamber via gravity and the compressed gas may travel generally in the opposite direction as the first portion of cold granular heat transfer particles.

The cold storage chamber may be at a cold storage pressure and the interior of the mixing chamber is maintained at a mixing pressure that is greater than the cold storage pressure. Step i) may include conveying the first portion of cold granular heat transfer particles through an inlet pressure regulating apparatus whereby the first portion of cold granular heat transfer particles are conveyed from the cold storage chamber into the mixing chamber while maintaining the mixing pressure.

The hot storage chamber may be at a hot storage pressure that is less than the mixing pressure. Step iii) may include conveying the first portion of warmed granular heat transfer particles through an outlet pressure regulating apparatus whereby the first portion of warmed granular heat transfer particles exit the mixing chamber and are conveyed from the mixing chamber to the hot storage chamber while maintaining the mixing pressure.

At least one of the cold storage pressure and the hot storage pressure may be about atmospheric pressure.

Steps i) to vi) may be conducted in a generally continuous manner whereby at least some of the first portion of cold granular heat transfer particles are in the mixing chamber at the same time as the second portion of cold granular heat transfer particles are introduced into the mixing chamber.

The method may include only partially charging the accumulator wherein the first portion of warmed granular heat transfer particles and second portion of warmed granular heat transfer particles are stored within the hot storage chamber and wherein a third portion of cold granular heat transfer particles remains within the cold storage chamber and does not enter the mixing chamber.

When operating in the discharging mode, the method may include i) conveying a quantity of granular heat transfer particles from the hot storage chamber into the interior of the mixing chamber; ii) contacting the granular heat transfer particles in the interior of the mixing chamber with the compressed gas traveling from the accumulator to the gas compressor/expander subsystem, thereby transferring thermal energy from the granular heat transfer particles to the compressed gas, warming the compressed gas and cooling the granular heat transfer particles; and iii) conveying cooled granular heat transfer particles from the interior of the mixing chamber into the cold storage chamber; iv) conveying a second quantity of warm granular heat transfer particles from the hot storage chamber into the interior of the mixing chamber; v) contacting the second quantity of warm granular heat transfer particles in the interior with the compressed gas traveling from the accumulator to the gas compressor/expander subsystem, thereby transferring thermal energy from the second quantity of warm granular heat transfer particles to the compressed gas to and warming the compressed gas and providing a second quantity of cooled granular heat transfer particles; and vi) conveying the second quantity of cooled granular heat transfer particles from the interior of the mixing chamber into the storage chamber.

BRIEF DESCRIPTION OF THE DRAWINGS

The drawings included herewith are for illustrating various examples of articles, methods, and apparatuses of the teaching of the present specification and are not intended to limit the scope of what is taught in any way.

DETAILED DESCRIPTION

Figure 1:
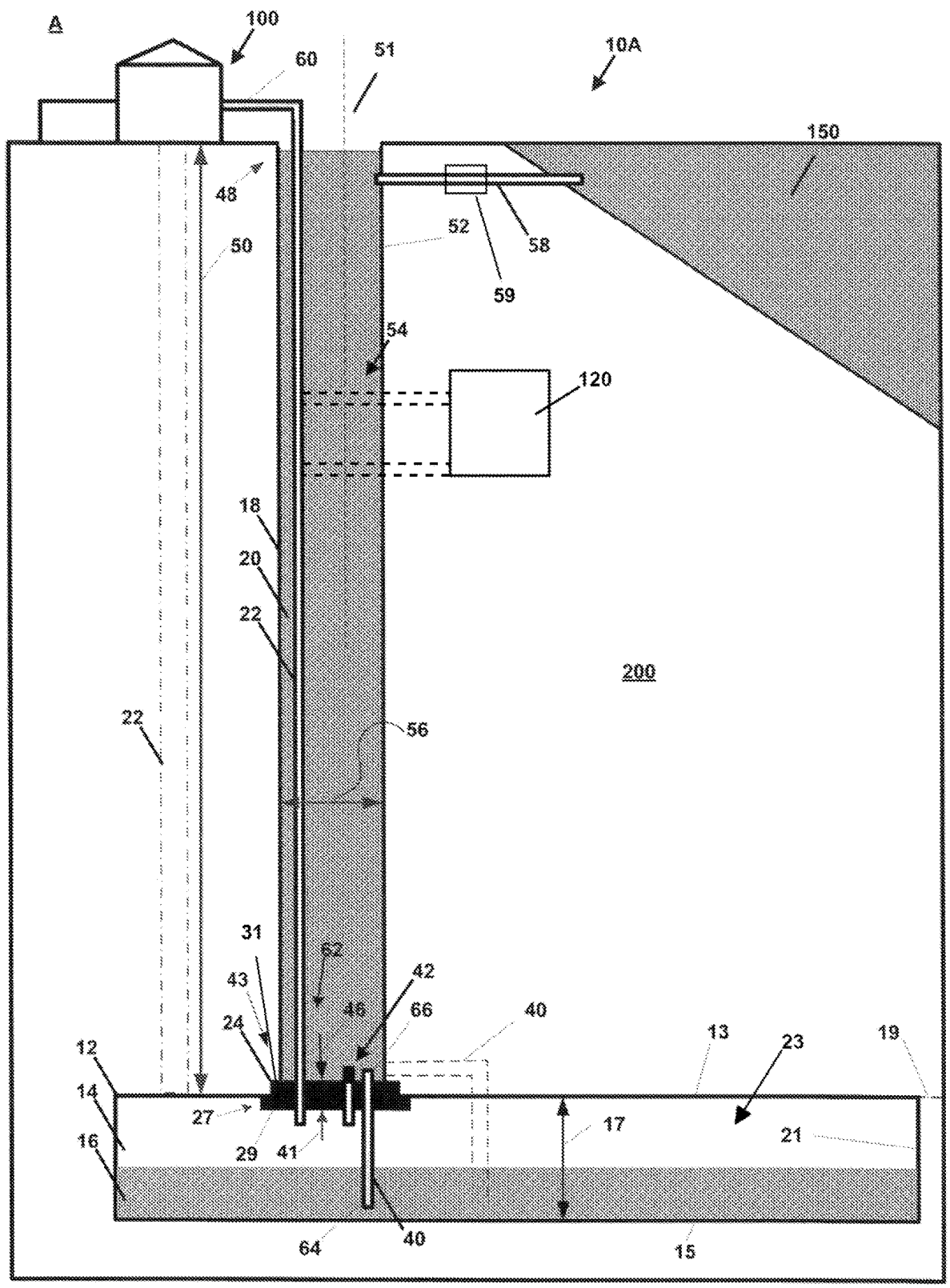
FIG. 1 is a schematic representation of one example of a hydrostatically compressed gas energy storage system.

Various apparatuses or processes will be described below to provide an example of an embodiment of each claimed invention. No embodiment described below limits any claimed invention and any claimed invention may cover processes or apparatuses that differ from those described below. The claimed inventions are not limited to apparatuses or processes having all the features of any one apparatus or process described below or to features common to multiple or all the apparatuses described below. It is possible that an apparatus or process described below is not an embodiment of any claimed invention. Any invention disclosed in an apparatus or process described below that is not claimed in this document may be the subject matter of another protective instrument, for example, a continuing patent application, and the applicants, inventors or owners do not intend to abandon, disclaim or dedicate to the public any such invention by its disclosure in this document.

Energy produced by some types of energy sources, such as windmills, solar panels and the like may tend to be produced during certain periods (for example when it is windy, or sunny respectively), and not produced during other periods (if it is not windy, or at night, etc.). However, the demand for energy may not always match the production periods, and it may be useful to store the energy for use later. Similarly, it may be helpful to store energy generated using conventional power generators (coal, gas and/or nuclear power plants for example) to help facilitate storage of energy generated during non-peak periods (e.g. periods when electricity supply could be greater than demand and/or when the cost of electricity is relatively high) and allow that energy to be utilized during peak periods (e.g. when the demand for electricity may be equal to or greater than the supply, and/or when the cost of electricity is relatively high).

As described herein, compressing and storing a gas (such as air), using a suitable compressed gas energy storage system, is one way of storing energy for later use. For example, during non-peak times, energy (i.e. electricity) can be used to drive compressors and compress a volume of gas to a desired, relatively high pressure for storage. The gas can then be stored at the relatively high pressure inside any suitable container or vessel, such as a suitable accumulator. To extract the stored energy, the pressurized gas can be released from the accumulator and used to drive any suitable expander apparatus or the like, and ultimately to be used to drive a generator or the like to produce electricity. The amount of energy per unit of storage volume that can be stored in a given compressed gas energy storage system may be related to the pressure at which the gas is compressed/stored, with higher pressure storage generally facilitating a higher energy storage. However, containing gases at relatively high pressures in conventional systems, such as between about 45-150 atm, can require relatively strong, specialized and often relatively costly storage containers/pressure vessels.

When gas is compressed for storage (for example during a charging mode) its temperature tends to increase, and if the gas passes through multiple compression stages its temperature can increase with each stage. Further, some compressors may have a preferred inlet temperature range in which they operate with a desired level of efficiency. Gas that has been compressed in a one compression stage may, in some systems, be heated to a temperature that is above a desired inlet temperature for a subsequent compressions stage. Reducing the temperature of the gas exiting an upstream compressions stage before it reaches a subsequent compression stage may be advantageous.

Similarly, when compressed gas is removed from an accumulator and expanded for electricity generation (for example when in a discharge mode), its temperature tends to decrease, and if the gas passes through multiple expansion stages its temperature can decrease with each stage. Further, some expanders may have a preferred inlet temperature range in which they operate with a desired level of efficiency. Gas that has been expanded in a one expansion stage may, in some systems, be cooled to a temperature that is below a desired inlet temperature for a subsequent expansion stage. Increasing the temperature of the gas exiting an upstream expansion stage before it reaches a subsequent expansion stage may be advantageous.

Optionally, heat that is removed/extracted from the gas exiting one or more compression stages when the system is in a charging mode of the system can be stored in a suitable thermal storage subsystem, and preferably that heat/thermal energy can then be re-introduced into the gas that is removed from the accumulator and is passing through suitable expansion stages during the discharge mode. This may help improve the overall efficiency of a compressed gas energy storage system. This may also help reduce and/or eliminate the need for heat sinks/sources or other apparatuses to dissipate heat when in the charging mode and/or supply new heat when in the discharge mode. Thermal energy/heat that is extracted from the compressed gas can be stored in any suitable thermal storage apparatus, including those described herein.

While the term "shaft" is used for convenience, the actual geometry of the structure may vary depending on the building techniques used, and may take the form of a decline, chamber or other such structure, and may be substantially vertical or may be inclined, and/or may be generally linear or may have a curved or varying geometry.

Referring to FIG. 1 one example of a hydrostatically compensated compressed gas energy storage system 10A, that can be used to compress, store and release a gas, includes an accumulator 12 that is located underground (although in another embodiment the accumulator may be located above ground). In this example, the accumulator 12 serves as a chamber for holding both compressed gas and a liquid (such as water) and can include any suitable type of pressure vessel or tank, or as in this example can be an underground cave or chamber that is within ground 200. In this embodiment, accumulator 12 is lined, for example using concrete, metal, plastic and combinations thereof or the like, to help make it substantially gas and/or liquid impermeable to help to prevent unwanted egress of gas or liquid from within the interior 23. In another embodiment, the accumulator is preferably impermeable to gas and or liquid without requiring a lining.

The accumulator 12 may have any suitable configuration, and in this example, includes an upper wall 13 and an opposing lower wall 15 that are separated from each other by an accumulator height 17. The upper and lower walls 13 and 15 may be of any suitable configuration, including curved, arcuate, angled, and the like, and in the illustrated example are shown as generally planar surfaces, that are generally parallel to a horizontal reference plane 19. The accumulator 12 also has an accumulator width (not shown—measured into the page as illustrated in FIG. 1). The upper and lower walls 13 and 15, along with one or more sidewalls 21 at least partially define an interior 23 of the accumulator 12, that has an accumulator volume.

The accumulator 12 in a given embodiment of the system 10A can be sized based on a variety of factors (e.g. the quantity of gas to be stored, the available space in a given location, etc.) and may, in some examples may be between about 1,000 m$^3$ and about 2,000,000 m$^3$ or more. For example, in this embodiment the accumulator 12 contains a layer of stored compressed gas 14 atop a layer of liquid 16, and its volume (and thus capacity) can be selected based on the quantity of gas 14 to be stored, the duration of storage required for system 10A, and other suitable factors which may be related to the capacity or other features of a suitable power source and/or power load (see power source/load S/L in FIG. 2) with which the system 10A is to be associated. The power source/load S/L may be, in some examples, a power grid, a power source (including renewable and optionally non-renewable sources) and the like. Furthermore, the power source and power load may be completely independent of each other (e.g. the power source 25 may be a renewable source, and the power load may be the grid).

Preferably, the accumulator 12 may be positioned below ground or underwater, but alternatively may be at least partially above ground. Positioning the accumulator 12 within the ground 200, as shown, may allow the weight of the ground/soil to help backstop/buttress the walls 13, 15 and 21 of the accumulator 12, and help resist any outwardly acting forces that are exerted on the walls 13, 15 and 21 of the interior 23 of the accumulator. Its depth in the ground is established according to the pressures at which the compression/expansion equipment to be used is most efficiently operated, the geology in the surrounding area and the like.

The gas that is to be compressed and stored in the accumulator 12 may be any suitable gas, including, but not limited to, air, nitrogen, noble gases and combinations thereof and the like. Using air may be preferable in some embodiments as a desired quantity of air may be drawn into the system from the surrounding, ambient environment and gas/air that is released from within the accumulator 12 can similarly be vented to the ambient environment, optionally without requiring further treatment. In this embodiment, the compressed gas 14 is compressed atmospheric air, and the liquid is water.

Optionally, to help provide access to the interior of the accumulator 12, for example for use during construction of the accumulator and/or to permit access for inspection and/or maintenance, the accumulator 12 may include at least one opening that can be sealed in a generally air/gas tight manner when the system 10A is in use. In this example, the accumulator 12 includes a primary opening 27 that is provided in the upper wall 13. The primary opening 27 may be any suitable size and may have a cross-sectional area (taken in the plane 19) that is adequate based on the specific requirements of a given embodiment of the system 10A. In one embodiment the cross-sectional area is between about 0.75 m2 and about 80 m2 but may be larger or smaller in a given embodiment.

When the system 10A is in use, the primary opening 27 may be sealed using any suitable type of partition that can function as a suitable sealing member. In the embodiment of FIG. 1, the system 10A includes a partition in the form of a bulkhead 24 that covers the primary opening 27. Some examples of suitable partitions are described in PCT/CA2018/050112 and PCT/CA2018/050282, which are incorporated herein by reference.

When the bulkhead 24 is in place, as shown in FIG. 1, it can be secured to, and preferably sealed with the accumulator wall, in this embodiment upper wall 13, using any suitable mechanism to help seal and enclose the interior 23. In other embodiments, the bulkhead 24 may have a different, suitable configuration.

The bulkhead 24 may be manufactured in situ, or may be manufactured offsite, and may be made of any suitable material, including, concrete, metal, plastics, composites and the like. In the illustrated embodiment, the bulkhead 24 is assembled in situ at the interface between a shaft 18 and the accumulator 12 of multiple pieces of reinforced concrete. In this embodiment the shaft 18 is illustrated schematically as a generally linear, vertical column. Alternatively, the shaft 18 may be a generally linear inclined shaft or preferably may be a curved and/or generally spiral/helical type configuration and which may be referred to as a shaft or generally as a decline. Some embodiments may include a generally spiralling configured decline that winds from an upper end to a lower end and can have an analogous function and attributes as the vertical shaft 18 of FIG. 1 despite having a different geometrical configuration. Discussions of the shaft/decline 18 and its purposes in one embodiment can be applied to other embodiments described herein.

Figure 3:
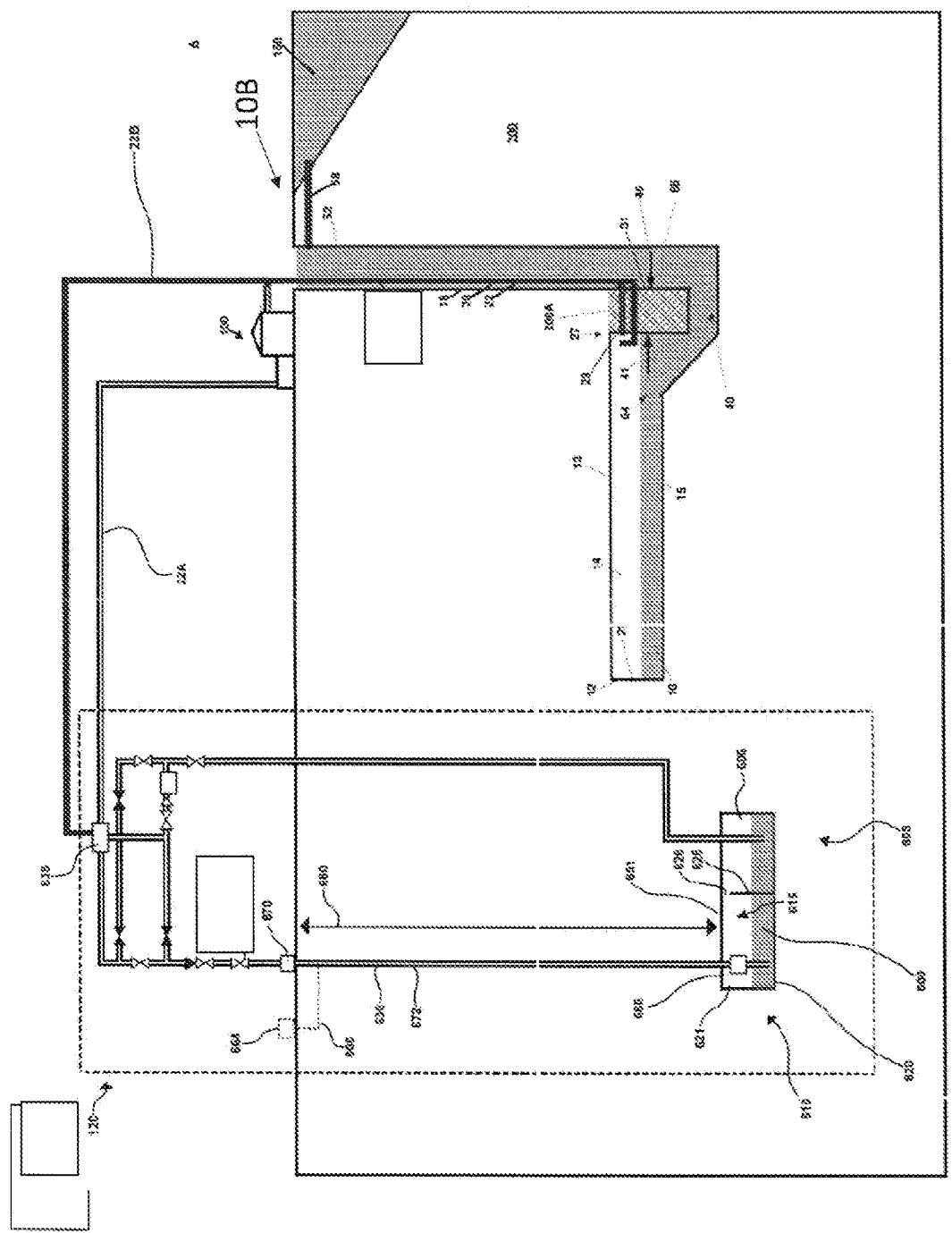
FIG. 3 is a schematic representation of another example of a hydrostatically compressed gas energy storage system.

In the embodiment of FIG. 1, the primary opening 27 is provided in the upper surface 13 of the accumulator 12. Alternatively, in other embodiments the primary opening 27 and any associated partition may be provided in different portions of the accumulator 12, including, for example, on a sidewall (such as sidewall 21 as shown in FIG. 3), in a lower surface (such as lower surface 15) or other suitable location. The location of the primary opening 27, and the associated partition, can be selected based on a variety of factors including, for example, the soil and underground conditions, the availability of existing structures (e.g. if the system 10A is being retrofit into some existing spaces, such as mines, quarries, storage facilities and the like), operating pressures, shaft configurations and the like. For example, some aspects of the systems 10A described herein may be retrofit into pre-existing underground chambers, which may have been constructed with openings in their sidewalls, floors and the like. Utilizing some of these existing formations may help facilitate construction and/or retrofit of the chambers used in the system and may reduce or eliminate the need to form additional openings in the upper surfaces of the chambers. Reducing the total number of openings in the accumulator may help facilitate sealing and may help reduce the chances of leaks and the like. In other embodiments, the components of the systems described herein may be purpose-built for the described purposes and may be configured in manner that helps facilitate both construction and operation of the systems.

When the primary opening 27 extends along the sidewall 21 of the accumulator 12 as shown in the embodiment of FIG. 3, it may be positioned such that is contacted by only the gas layer 14 (i.e. toward the top of the accumulator 12), contacted by only the liquid layer 16 (i.e. submerged within the liquid layer 16 and toward the bottom of the accumulator) and/or by a combination of both the gas layer 14 and the liquid layer 16 (i.e. partially submerged and partially non-submerged in the liquid). The specific position of the free surface of the liquid layer 16 (i.e. the interface between the liquid layer 16 and the gas layer 14) may change while the system 10 is in use as gas is forced into (causing the liquid layer to drop) and/or withdrawn from the accumulator (allowing the liquid level to rise).

When the accumulator 12 is in use, at least one of the pressurized gas layer 14 and the liquid layer 16 may contact and exert pressure on the inner-surface 29 of the bulkhead 24, which will result in a generally outwardly, (upwardly in this embodiment) acting internal accumulator force, represented by arrow 41 in FIG. 1, acting on the bulkhead 24. The magnitude of the internal accumulator force 41 acting on the partition may be at least partially dependent on the pressure of the gas 14 and the cross-sectional area (taken in plane 19) of the lower surface 29. For a given lower surface 29 area, the magnitude of the internal accumulator force 41 may vary generally proportionally with the pressure of the gas 14.

In some embodiments, for example if the compressed gas energy storage system is not hydrostatically compensated, the partition may be configured to resist substantially the entire internal accumulator force 41 and/or may be reinforced with the ground 200 or other suitable structures. Alternatively, an inwardly, (downwardly in this embodiment) acting force can be applied to the outer-surface 31 of the bulkhead 24 to help at least partially offset and/or counterbalance the internal accumulator force 41. Applying a counter force of this nature may help reduce the net force acting on the bulkhead 24 while the system 10 is in use. This may help facilitate the use of a bulkhead 24 with lower pressure tolerances than would be required if the bulkhead 24 had to resist the entire magnitude of the internal accumulator force 41. This may allow the bulkhead 24 be relatively smaller, lighter and less costly. This arrangement may also help reduce the chances of the bulkhead 24 failing while the system 10 is in use. Optionally, a suitable counter force may be created by subjecting the upper surface 31 to a pressurized environment, such as a pressurized gas or liquid or the distributed weight from a pile of solid material that is in contact with the upper surface 31, and calibrating the pressure acting on the upper surface 31 (based on the relative cross-sectional area of the upper surface 31 and the pressure acting on the lower surface 29) so that the resulting counter force, shown by arrow 46 in FIG. 1, has a desirable magnitude. In some configurations, the magnitude of the counter force 46 may be between about 80% and about 99% of the internal accumulator force 41 and may optionally be between about 90% and about 97% and may be about equal to the magnitude of the internal accumulator force 41.

In the present embodiment, the system 10 includes a shaft 18 that is configured so its lower end 43 is in communication with the opening 27 of the accumulator 12, and its upper end 48 that is spaced apart from the lower end 43 by a shaft height 50. At least one sidewall 52 extends from the lower end 43 to the upper end 48, and at least partially defines a shaft interior 54 having a volume. In this embodiment, the shaft 18 is generally linear and extends along a generally vertical shaft axis 51, but may have other configurations, such as a linear, curved, or helical decline, in other embodiments. The upper end 48 of the shaft 18 may be open to the atmosphere A, as shown, or may be capped, enclosed or otherwise sealed. In this embodiment, shaft 18 is generally cylindrical with a diameter 56 of about 3 metres, and in other embodiments the diameter 56 may be between about 2 m and about 15 m or more, or may be between about 5 m and 12 m, or between about 2 m and about 5 m. In such arrangements, the interior 52 of the shaft 18 may be able to accommodate about 1,000-150,000 $m^3$ of water.

In this arrangement, the bulkhead 24 is positioned at the interface between the shaft 18 and the accumulator 12, and the outer surface 31 (or at least a portion thereof) closes and seals the lower end 43 of the shaft 18. Preferably, the other boundaries of the shaft 18 (e.g. the sidewall 52) are generally liquid impermeable, such that the interior 54 can be filled with, and can generally retain a quantity of a liquid, such as water 20. A water supply/replenishment conduit 58 can provide fluid communication between the interior 54 of the shaft 18 and a water source/sink 150 to allow water to flow into or out of the interior of the shaft 18 as required when the system 10 is in operational modes. Optionally, a flow control apparatus 59 (as shown in FIG. 1) may be provided in the water supply/replenishment conduit 58. The flow control apparatus 59 may include a valve, sluice gate, or other suitable mechanism. The flow control apparatus 59 can be open while the system 10 is in operational modes to help facilitate the desired flow of water between the shaft 18 and the water source/sink 150. Optionally, the flow control apparatus 59 can be closed to fluidly isolate the shaft 18 and the water source/sink 150 if desired. For example, the flow control apparatus 59 may be closed to help facilitate draining the interior 54 of the shaft 18 for inspection, maintenance or the like.

The water source/sink 150 may be of any suitable nature, and may include, for example a connection to a municipal water supply or reservoir, a purposely built reservoir, a storage tank, a water tower, and/or a natural body of water such as a lake, river or ocean, groundwater, or an aquifer. In the illustrated example, the water source/sink 150 is illustrated as a lake. Allowing water to flow through the conduit 58 may help ensure that a sufficient quantity of water 20 may be maintained with shaft 18 and that excess water 20 can be drained from shaft 18. The conduit 58 may be connected to the shaft 18 at any suitable location, and preferably is connected toward the upper end 48. Preferably, the conduit 58 can be positioned and configured such that water will flow from the source/sink 150 to the shaft 18 via gravity, and need not include external, powered pumps or other conveying apparatus. Although the conduit 58 is depicted in the figures as horizontal, it may be non-horizontal.

In this example, the water 20 in the shaft 18 bears against the outside of bulkhead 24 and is thereby supported atop bulkhead 24. The amount of pressure acting on the height 50 of the water column.

The layer of stored compressed air 14 underlying bulkhead 24 serves, along with the technique by which bulkhead 24 is stably affixed to the surrounding in the ground, in one alternative to surrounding stone in the ground at the interface between accumulator 12 and shaft 18, to support bulkhead 24 and the quantity of liquid contained within shaft 18.

Preferably, as will be described, the pressure at which the quantity of water 20 bears against bulkhead 24 can be maintained so that magnitude of the counter force 46 is equal, or nearly equal, to the magnitude of the internal accumulator force 41 exerted by the compressed gas in compressed gas layer 14 stored in accumulator 12. In the illustrated embodiment, system 10 is operated so as to maintain a pressure differential (i.e. the difference between gas pressure inside the accumulator 12 and the hydrostatic pressure at the lower end 43 of the shaft 18) below a threshold amount—an amount preferably between 0 and 4 Bar, such as 2 Bar—the resulting net force acting on the bulkhead 24. Maintaining the net pressure differential, and the related net force magnitude, below a threshold net pressure differential limit may help reduce the need for the bulkhead 24 to be very large and highly-reinforced, and accordingly relatively expensive. In alternative embodiments, using a relatively stronger bulkhead 24 and/or installation technique for affixing the bulkhead 24 to the accumulator 12 may help withstand relatively higher pressure and net pressure differential, but may be more expensive to construct and install, all other things being equal. Furthermore, the height 17 of the accumulator 12 may be important to the pressure differential: if the height 17 is about 10 metres, then the maximum upward pressure on the bulkhead 24 will be 1 Bar higher than the downward pressure on the bulkhead 24 from the water 20 in shaft 18. The maximum pressure differential that is experienced by bulkhead 24 may increase by about 0.1 bar for every meter that the height 17 of the accumulator 12 is increased.

Each of shaft 18 and accumulator 12 may be formed in ground 200 using techniques like those used for producing mineshafts and other underground structures.

To help maintain substantially equal outward and inward forces 41 and 46 respectively on the bulkhead 24, the system 10 may be utilized to help maintain a desired differential in accumulator and shaft pressures that is below a threshold amount. These pressures may be controlled by adding or removing gas from the compressed gas layer 14 in accumulator 12 using any suitable compressor/expander subsystem 100, and in turn conveying water between the liquid layer 16 in accumulator 12 and the water 20 in shaft 18.

In this embodiment, the system 10A includes a gas flow path that provides fluid communication between the compressor/expander subsystem 100 and the accumulator 12. The gas flow path may include any suitable number of conduits, passages, hoses, pipes and the like and any suitable equipment may be provided in (i.e. in air flow communication with) the gas flow path, including, compressors, extractors, heat exchangers, valves, sensors, flow meters and the like. Referring to the example of FIG. 1, in this example the gas flow path includes a gas conduit 22 that is provided to convey compressed air between the compressed gas layer 14 and the compressor/expander subsystem 100, which can convert the potential energy of compressed air to and from electricity. Similarly, a liquid supply conduit 40 is configured to convey water between the liquid layer 16 and the water 20 in shaft 18. Each conduit 22 and 40 may be formed from any suitable material, including metal, the surrounding rock, plastic and the like.

In this example, the gas conduit 22 has an upper end 60 that is connected to the compressor/expander subsystem 100, and a lower end 62 that is in communication with the compressed gas layer 14. The gas conduit 22 is, in this example, positioned inside and extends within the shaft 18, and passes through the bulkhead 24 to reach the compressed gas layer 14. Positioning the gas conduit 22 within the shaft 18 may eliminate the need to bore a second shaft and/or access path from the surface to the accumulator 12. The positioning in the current embodiment may also leave the gas conduit 22 generally exposed for inspection and maintenance, for example by using a diver or robot that can travel through the water 20 within the shaft 18 and/or by draining some or all the water from the shaft 18. Alternatively, as shown using dashed lines in FIG. 1 and in the embodiment of FIG. 3, the gas conduit 22 may be external the shaft 18. Positioning the gas conduit 22 outside the shaft 18 may help facilitate remote placement of the compressor/expander subsystem 100 (i.e. it need not be proximate the shaft 18) and may not require the exterior of the gas conduit 22 (or its housing) to be submerged in water. This may also eliminate the need for the gas conduit 22 to pass through the partition that separates the accumulator 12 from the shaft 18.

The liquid supply conduit 40 is, in this example, configured with a lower end 64 that is submerged in the water layer 16 while the system 10 is in use and a remote upper end 66 that is in communication with the interior 54 of the shaft 18. In this configuration, the liquid supply conduit 40 can facilitate the exchange of liquid between the liquid layer 16 and the water 20 in the shaft 18. As illustrated in FIG. 1, the liquid supply conduit 40 can pass through the bulkhead 24 (as described herein), or alternatively, as shown using dashed lines, may be configured to provide communication between the liquid layer 16 and the water 20, but not pass through the bulkhead 24.

In this arrangement, as more gas is transferred into the gas layer 14 during an accumulation cycle, and its pressure increases, in this alternative slightly, water in the water layer 16 can be displaced and forced upwards through the liquid supply conduit 40 into shaft 18 against the hydrostatic pressure of the water 20 in the shaft 18. More particularly, water can preferably freely flow from the bottom of accumulator 12 and into shaft 18, and ultimately may be exchanged with the source/sink 150 of water, via a replenishment conduit 58. Alternatively, any suitable type of flow limiting or regulating device (such as a pump, valve, orifice plate and the like) can be provided in the water conduit 40. When gas is removed from the gas layer 14, water can be forced from the shaft 18, through the water conduit 40, to refill the water layer 16. The flow through the replenishment conduit 58 can help ensure that a desired quantity of water 20 may be maintained within shaft 18 as water is forced into and out of the water layer 16, as excess water 20 can be drained from and make-up water can be supplied to the shaft 18. This arrangement can allow the pressures in the accumulator 12 and shaft 18 to at least partially, automatically re-balance as gas is forced into and released from the accumulator 12.

Preferably, the lower end 64 of the liquid supply conduit 40 is positioned so that it is and generally remains submerged in the liquid layer 16 while the system 10 is in operational modes and is not in direct communication with the gas layer 14. In the illustrated example, the lower wall 15 is planar and is generally horizontal (parallel to plane 19, or optionally arranged to have a maximum grade of between about 0.01% to about 1%, and optionally between about 0.5% and about 1%, from horizontal), and the lower end 64 of the liquid supply conduit 40 is placed close to the lower wall 15. If the lower wall 15 is not flat or not generally horizontal, the lower end 64 of the liquid supply conduit 40 is preferably located in a low point of the accumulator 12 to help reduce the chances of the lower end 64 being exposed to the gas layer 14.

Similarly, to help facilitate extraction of gas from the gas layer, the lower end 62 of the gas conduit 22 is preferably located close to the upper wall 13, or if the upper wall 13 is not flat or generally horizontal at a high-point in the interior 23 of the accumulator 12. This may help reduce material trapping of any gas in the accumulator 12. For example, if the upper wall 13 were oriented on a grade, the point at which gas conduit 22 interfaces with the gas layer (i.e. its lower end 62) should be at a high point in the accumulator 12, to help avoid significant trapping of gas.

In the embodiment of FIG. 1, the partition includes a fabricated bulkhead 24 that is positioned to cover, and optionally seal the primary opening 27 in the accumulator perimeter. Alternatively, in other embodiments, the partition may be at least partially formed from natural materials, such as rock and the like. For example, a suitable partition may be formed by leaving and/or shaping portions of naturally occurring rock to help form at least a portion of the pressure boundary between the interior of the accumulator and the shaft. Such formations may be treated, coated or otherwise modified to help ensure they are sufficiently gas impermeable to be able to withstand the desired operating pressure differentials between the accumulator interior and the shaft. This may be done, in some embodiments, by selectively excavating the shaft 18 and accumulator 12 such that a portion of the surrounding rock is generally undisturbed during the excavation and construction of the shaft 18 and accumulator 12. Alternatively, rock or other such material may be re-introduced into a suitable location within the accumulator 12 and/or shaft 18 after having been previously excavated. This may help reduce the need to manufacture a separate bulkhead and install it within the system 10. In arrangements of this nature, the primary opening 27 may be formed as an opening in a sidewall 21 of the accumulator 12, or alternatively one side of the accumulator 12 may be substantially open such that the primary opening 27 extends substantially the entire accumulator height 17, and forms substantially one entire side of the accumulator 12.

When the accumulator 12 is in use, at least one of the pressurized gas layer 14 and the liquid layer 16, or both, may contact and exert pressure on the inner-surface 29 of the bulkhead 24, which will result in a generally outwardly, (upwardly in this embodiment) acting internal accumulator force, represented by arrow 41 in FIG. 1, acting on the bulkhead 24. The magnitude of the internal accumulator force 41 is dependent on the pressure of the gas 14 and the cross-sectional area (taken in plane 19) of the lower surface 29. For a given lower surface 29 area, the magnitude of the internal accumulator force 41 may vary generally proportionally with the pressure of the gas 14.

Preferably, an inwardly, (downwardly in this embodiment) acting force can be applied to the outer-surface 31 of the bulkhead 24 to help offset and/or counterbalance the internal accumulator force 41. Applying a counter force of this nature may help reduce the net force acting on the bulkhead 24 while the system 10 is in use. This may help facilitate the use of a bulkhead 24 with lower pressure tolerances than would be required if the bulkhead 24 had to resist the entire magnitude of the internal accumulator force 41. This may allow the bulkhead 24 be relatively smaller, lighter and less costly. This arrangement may also help reduce the chances of the bulkhead 24 failing while the system 10 is in use. Optionally, a suitable counter force may be created by subjecting the upper surface 31 to a pressurized environment, such as a pressurized gas or liquid that is in contact with the upper surface 31, and calibrating the pressure acting on the upper surface 31 (based on the relative cross-sectional area of the upper surface 31 and the pressure acting on the lower surface 29) so that the resulting counter force, shown by arrow 46 in FIG. 1, has a desirable magnitude. In some configurations, the magnitude of the counter force 46 may be between about 80% and about 99% of the internal accumulator force 41 and may optionally be between about 90% and about 97% and may be about equal to the magnitude of the internal accumulator force 41.

In the present embodiment, the system 10 includes a shaft 18 having a lower end 43 that is in communication with the opening 27 in the upper wall 13 of the accumulator 12, and an upper end 48 that is spaced apart from the lower end 43 by a shaft height 50. At least one sidewall 52 extends from the lower end 43 to the upper end 48, and at least partially defines a shaft interior 54 having a volume. In this embodiment, the shaft 18 is generally linear and extends along a generally vertical shaft axis 51, but may have other configurations, such as a linear or helical decline, in other embodiments. The upper end 48 of the shaft 18 may be open to the atmosphere A, as shown, or may be capped, enclosed or otherwise sealed. In this embodiment, shaft 18 is generally cylindrical with a diameter 56 of about 3 metres, and in other embodiments the diameter 56 may be between about 2 m and about 15 m or more, or may be between about 5 m and 12 m, or between about 2 m and about 5 m. In such arrangements, the interior 52 of the shaft 18 may be able to accommodate about 1,000-150,000 m$^3$ of water. In other embodiments the shaft need not be cylindrical and may have other cross-sectional geometries with the same hydraulic diameter.

In this arrangement, the bulkhead 24 is positioned at the interface between the shaft 18 and the accumulator 12, and the outer surface 31 (or at least a portion thereof) closes and seals the lower end 43 of the shaft 18. Preferably, the other boundaries of the shaft 18 (e.g. the sidewall 52) are generally liquid impermeable, such that the interior 54 can be filled with, and can generally retain a quantity of a liquid, such as water 20. A water supply/replenishment conduit 58 can provide fluid communication between the interior 54 of the shaft 18 and a water source/sink 150 to allow water to flow into or out of the interior of the shaft 18 as required when the system 10 is in use. Optionally, a flow control valve 59 (as shown in FIG. 1) may be provided in the water supply/replenishment conduit 58. The flow control valve 59 can be open while the system 10 is in use to help facilitate the desired flow of water between the shaft 18 and the water source/sink 150. Optionally, the flow control valve 59 can be closed to fluidly isolate the shaft 18 and the water source/sink 150 if desired. For example, the flow control valve 59 may be closed to help facilitate draining the interior 54 of the shaft 18 for inspection, maintenance or the like.

The water source/sink 150 may be of any suitable nature, and may include, for example a connection to a municipal water supply or reservoir, a purposely built reservoir, a storage tank, a water tower, and/or a natural body of water such as a lake, river or ocean, groundwater, or an aquifer. In the illustrated example, the water source/sink 150 is illustrated as a lake. Allowing water to flow through the conduit 58 may help ensure that a sufficient quantity of water 20 may be maintained with shaft 18 and that excess water 20 can be drained from shaft 18. The conduit 58 may be connected to the shaft 18 at any suitable location, and preferably is connected toward the upper end 48. Preferably, the conduit 58 can be positioned and configured such that water will flow from the source/sink 150 to the shaft 18 via gravity, and need not include external, powered pumps or other conveying apparatus. Although the conduit 58 is depicted in the figures as horizontal, it may be non-horizontal.

In this example, the water 20 in the shaft 18 bears against the outside of bulkhead 24 and is thereby supported atop bulkhead 24. The amount of pressure acting on the outer surface 31 of the bulkhead 24 in this example will vary with the volume of water 20 that is supported, which for a given diameter 56 will vary with the height 50 of the water column. In this arrangement, the magnitude of the counter force 46 can then be generally proportional to the amount of water 20 held in the shaft 18. To increase the magnitude of the counter force 46, more water 20 can be added. To reduce the magnitude of the counter force 46, water 20 can be removed from the interior 54.

The layer of stored compressed air 14 underlying bulkhead 24 serves, along with the technique by which bulkhead 24 is stably affixed to the surrounding in the ground, in one alternative to surrounding stone in the ground at the interface between accumulator 12 and shaft 18, to support bulkhead 24 and the quantity of liquid contained within shaft 18.

Preferably, as will be described, the pressure at which the quantity of water 20 bears against bulkhead 24 and can be maintained so that magnitude of the counter force 46 is as equal, or nearly equal, to the magnitude of the internal accumulator force 41 exerted by the compressed gas in compressed gas layer 14 stored in accumulator 12. In the illustrated embodiment, operating system 10 so as to maintain a pressure differential (i.e. the difference between gas pressure inside the accumulator 12 and the hydrostatic pressure at the lower end 43 of the shaft 18) within a threshold amount—an amount preferably between 0 and 4 Bar, such as 2 Bar—the resulting net force acting on the bulkhead 24 (i.e. the difference between the internal accumulator force 41 and the counter force 46) can be maintained below a pre-determined threshold net force limit. Maintaining the net pressure differential, and the related net force magnitude, below a threshold net pressure differential limit may help reduce the need for the bulkhead 24 to be very large and highly-reinforced, and accordingly relatively expensive. In alternative embodiments, using a relatively stronger bulkhead 24 and/or installation technique for affixing the bulkhead 24 to the accumulator 12 may help withstand relatively higher pressure and net pressure differential, but may be more expensive to construct and install, all other things being equal. Furthermore, the height 17 of the accumulator 12 may be important to the pressure differential: if the height 17 is about 10 metres, then the upward pressure on the bulkhead 24 will be 1 Bar higher than the downward pressure on the bulkhead 24 from the water 20 in shaft 18.

Each of shaft 18 and accumulator 12 may be formed in the ground 200 using any suitable techniques, including techniques that are like those used for producing mineshafts and other underground structures.

To help maintain substantially equal outward and inward forces 41 and 46 respectively on the bulkhead 24, the system 10 may be utilized to help maintain a desired differential in accumulator and shaft pressures that is below a threshold amount. These pressures may be controlled by adding or removing gas from the compressed gas layer 14 accumulator 12 using any suitable compressor/expander subsystem 100, and water can be conveyed between the liquid layer 16 and the water 20 in shaft 18.

In this embodiment, a gas conduit 22 is provided to convey compressed air between the compressed gas layer 14 and the compressor/expander subsystem 100, which can convert compressed air energy to and from electricity. Similarly, a liquid conduit 40 is configured to convey water between the liquid layer 16 and the water 20 in shaft 18. Each conduit 22 and 40 may be formed from any suitable material, including metal, plastic and the like.

In this example, the gas conduit 22 has an upper end 60 that is connected to the compressor/expander subsystem 100, and a lower end 62 that is in communication with the gas layer 14. The gas conduit 22 is, in this example, positioned inside and extends within the shaft 18, and passes through the bulkhead 24 to reach the gas layer 14. Positioning the gas conduit 22 within the shaft 18 may eliminate the need to bore a second shaft and/or access point from the surface to the accumulator 12. This position may also leave the gas conduit 22 generally exposed for inspection and maintenance, for example by using a diver or robot that can travel through the water 20 within the shaft 18 and/or by draining some or all the water from the shaft 18. Alternatively, as shown using dashed lines in FIG. 1 and in the embodiment of FIG. 17, the gas conduit 22 may be external the shaft 18. Positioning the gas conduit 22 outside the shaft 18 may help facilitate remote placement of the compressor/expander subsystem 100 (i.e. it need not be proximate the shaft 18) and may not require the exterior of the gas conduit 22 (or its housing) to be submerged in water. This may also eliminate the need for the gas conduit 22 to pass through the partition that separates the accumulator 12 from the shaft 18.

Figure 2:
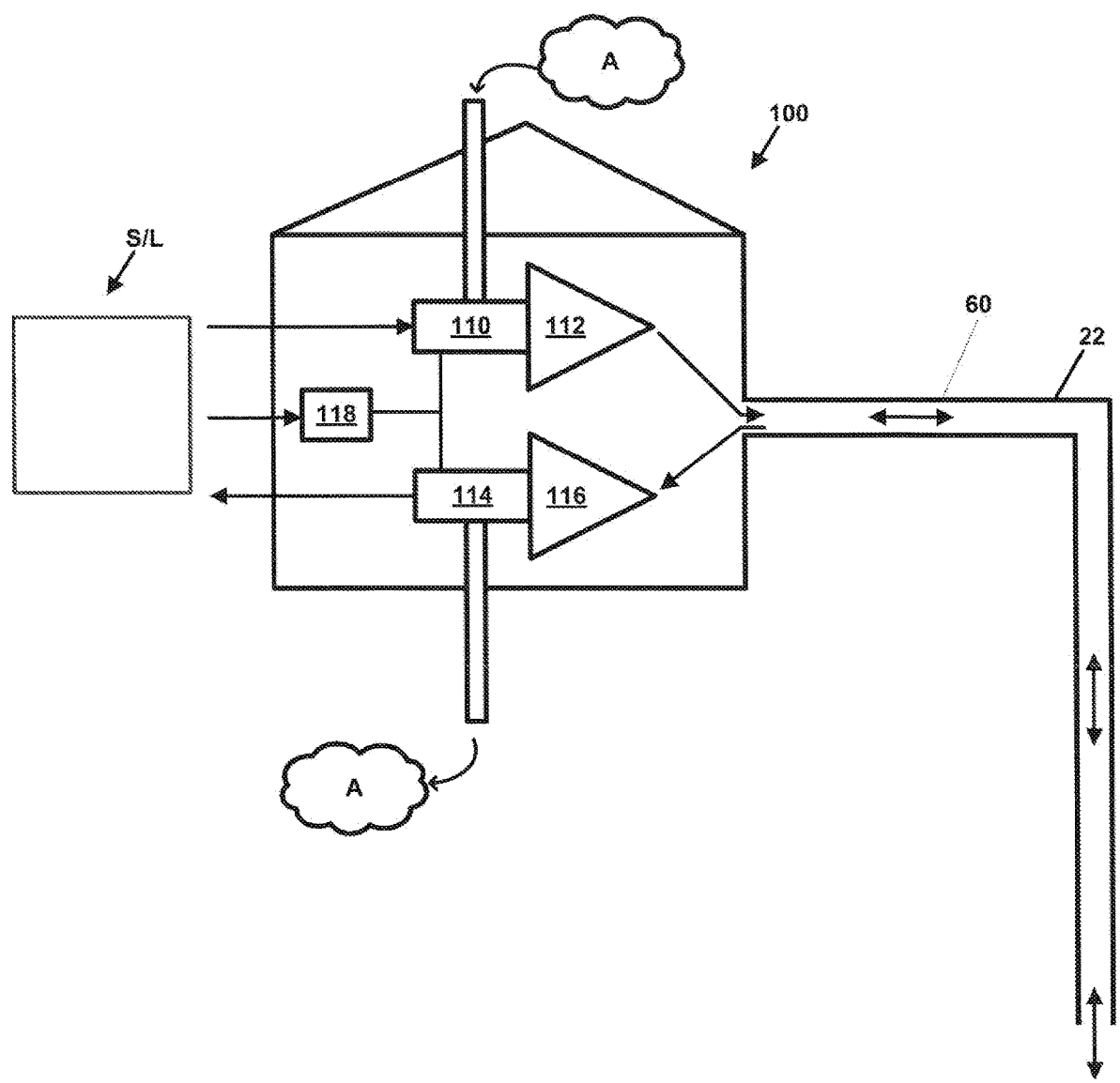
FIG. 2 is a schematic representation of a portion of the system of FIG. 1

FIG. 2 is a schematic view of components of one example of a compressor/expander subsystem 100 for the compressed gas energy storage system 10 described herein. In this example, the compressor/expander subsystem 100 includes a compressor 112 of single or multiple stages, driven by a motor 110 that is powered, in one alternative, using electricity from a power grid or by a renewable power source or the like, and optionally controlled using a suitable controller 118. Compressor 112 is driven by motor 110 during an accumulation stage of operation, and draws in atmospheric air A, compresses the air, and forces it down into gas conduit 22 for storage in accumulator 12 (via thermal storage subsystem 120 (see FIG. 1 for example and FIGS. 9-11 for alternate embodiments) in embodiments including same). Compressor/expander subsystem 100 also includes an expander 116 driven by compressed air exiting from gas conduit 22 during an expansion stage of operation and, in turn, driving generator 114 to generate electricity. After driving the expander 116, the expanded air is conveyed for exit to the atmosphere A. While shown as separate apparatuses, the compressor 112 and expander 116 may be part of a common apparatus, as can a hybrid motor/generator apparatus. Optionally, the motor and generator may be provided in a single machine.

Air entering or leaving compressor/expander subsystem 100 may be conditioned prior to its entry or exit. For example, air exiting or entering compressor/expander subsystem 100 may be heated and/or cooled to reduce undesirable environmental impacts or to cause the air to be at a temperature suited for an efficient operating range of a stage of compressor 112 or expander 116. For example, air (or other gas being used) exiting a given stage of a compressor 112 may be cooled prior to entering a subsequent compressor stage and/or the accumulator 12, and/or the air may be warmed prior to entering a given stage of an expander 116 and may be warmed between expander stages in systems that include two or more expander stages arranged in series.

Controller 118 operates compressor/expander subsystem 100 to switch between accumulation and expansion stages as required, including operating valves for preventing or enabling release of compressed air from gas conduit 22 on demand.

Optionally, the system 10A may include a thermal storage subsystem 120 (illustrated schematically in FIG. 1) that is configured to transfer heat/thermal energy out of and preferably also into the gas flowing through the gas flow path between the accumulator and the compressor/expander subsystem 100. Preferably, the thermal storage subsystem 120 is configured to extract thermal energy from the gas exiting at least one of the one or more compression stages in a given compressor/expander subsystem 100, and preferably may be configured to extract heat from the gas exiting each compression stage 112. The extracted thermal energy can then be stored for a period, and then reintroduced into the gas as it is removed from the accumulator 12 and passed through one or more expanders 116.

FIG. 3 is a schematic representation of another example of a compressed gas energy storage system 10B with a thermal storage subsystem 120 that is provided in the gas flow path between the compressor/expander subsystem 100 and the accumulator 12. The compressed gas energy storage system 10B is analogous to the compressed gas energy storage system 10A, and like features are identified using like reference characters. While one example is explained herein, other suitable thermal storage subsystems may be utilized in other embodiments, including those described in PCT/CA2018/050112 and PCT/CA2018/050282, which are incorporated herein by reference. The thermal storage subsystem 120 may also be used in combination with the systems 10A and 10B, and other systems described herein, and other examples of thermal storage subsystems may be used in combination with these systems.

In the example of FIG. 3, the gas conduit 22 that conveys the compressed gas between the compressed gas layer 14 and compressor/expander subsystem 100 includes an upper portion 22A that extends between the compressor/expander subsystem 100 and thermal storage subsystem 120, and a lower portion 22B that extends between thermal storage subsystem 120 and accumulator 12.

The thermal storage subsystem 120 may include any suitable type of thermal storage apparatus, including, for example latent and/or sensible storage apparatuses. The thermal storage apparatus(es) may be configured as single stage, two stage and/or multiple stage storage apparatus(es). Similarly, the thermal storage subsystem 120 may include one or more heat exchangers (to transfer thermal energy into and/or out of the thermal storage subsystem 120) and one or more storage apparatuses (including, for example storage reservoirs for holding thermal storage fluids and the like). Any of the thermal storage apparatuses may either be separated from or proximate to their associated heat exchanger and may also incorporate the associated heat exchanger in a single compound apparatus (i.e. in which the heat exchanger is integrated within the storage reservoir). Preferably, the heat exchangers utilized in the thermal storage subsystem 120 are provided in the gas flow path between the compressor/expanded subsystem and the accumulator and are operable to transfer thermal energy between the compressed gas travelling through the gas flow path and the thermal storage media (which may be a solid, liquid or gas).

The exchangers may be any suitable type of heat exchanger for a given type of thermal storage media, and may include, for example, indirect heat exchangers or direct heat exchangers. The preferable type of heat exchanger for a given system may depend on a variety of factors and/or elements of the system. For example, a direct heat exchanger (i.e. that permits direct contact between the two sides/ streams of the exchanger) may help facilitate for more conductivity between the compressed gas and thermal storage media and may, under some circumstances, be relatively more efficient in transferring thermal energy between the two than a comparable indirect heat exchanger. A direct heat exchanger may be preferred when using solid thermal storage media, such as sand, rocks or gravel and may also be used in combination with a thermal storage liquid if both the gas and liquid streams are maintained under suitable conditions to help maintain the thermal storage liquid in its liquid state, and to avoid boiling and/or mixing of the gas stream and liquid stream.

An indirect heat exchanger may be preferable in systems in which the compressed gas is to be kept separate from the thermal storage media, such as if the thermal storage media needs to be kept under specific conditions, including pressure and/or if both streams in the heat exchanger are gaseous (or would boil if a liquid) such that there would be a mixing of the thermal storage media and the compressed system gas within the heat exchanger.

In the illustrated embodiment, substantial portions of the thermal storage subsystem 120 are located underground, which may help reduce the use of above-ground land and may help facilitate the use of the weight of the earth/rock to help contain the pressure in the storage reservoir. That is, the outward-acting pressure within the storage reservoir containing the heated and, optionally non-heated thermal storage media, can be substantially balanced by the inwardly-acting forces exerted by the earth and rock surrounding the first reservoir. In some examples, if a liner or other type of vessel are provided in the storage reservoir such structures may carry some of the pressure load but are preferably backed-up by and/or supported by the surrounding earth/ rock. This can help facilitate pressurization of the storage reservoir to the desired storage pressures, without the need for providing a manufactured pressure vessel that can withstand the entire pressure differential. In this example, the thermal storage subsystem 120 also employs multiple stages including, for example, multiple sensible and/or latent thermal storage stages such as stages having one or more phase change materials and/or pressurized water, or other heat transfer fluid arranged in a cascade. It will be noted that, if operating the system for partial storage/retrieval cycles, the sizes of the stages may be sized according to the time cycles of the phase change materials so that the phase changes, which take time, take place effectively within the required time cycles.

In general, as gas is compressed by the compressor/ expander subsystem 100 when in the charging mode and is conveyed for storage towards accumulator 12, the heat of the compressed gas can be drawn out of the compressed gas and into the thermal storage subsystem 120 for sensible and/or latent heat storage. In this way, at least a portion of the heat energy is saved for future use instead of, for example being leached out of the compressed gas into water 20 or in the liquid layer 16, and accordingly substantially lost (i.e. non-recoverable by the system 10).

Similarly, when in a discharge mode as gas is released from accumulator 12 towards compressor/expander subsystem 100 it can optionally be passed through thermal storage subsystem 120 to re-absorb at least some of the stored heat energy on its way to the expander stage of the compressor/expander subsystem 100. Advantageously, the compressed gas, accordingly heated, can reach the compressor/expander subsystem 100 at a desired temperature (an expansion temperature—that is preferably warmer/higher than the accumulator temperature), and may be within about 10° C. and about 60° C. of the exit temperature in some examples, that may help enable the expander to operate within its relatively efficient operating temperature range(s), rather than having to operate outside of the range with cooler compressed gas.

In some embodiments, the thermal storage subsystem 120 may employ at least one phase change material, preferably multiple phase change materials, multiple stages and materials that may be selected according to the temperature rating allowing for the capture of the latent heat. Generally, phase change material heat can be useful for storing heat of approximately 150 degrees Celsius and higher. The material is fixed in location and the compressed air to be stored or expanded is flowed through the material. In embodiments using multiple cascading phase change materials, each different phase change material represents a storage stage, such that a first type of phase change material may change phase thereby storing the heat at between 200 and 250 degrees Celsius, a second type of phase change material may change phase thereby storing the heat at between 175 and 200 degree Celsius, and a third type of phase change material may change phase thereby storing the heat at between 150 and 175 degrees Celsius. One example of a phase change material that may be used with some embodiments of the system includes a eutectic mixture of sodium nitrate and potassium nitrate, or the HITEC® heat transfer salt manufactured by Coastal Chemical Co. of Houston, Texas.

In embodiments of the thermal storage subsystem 120 employing sensible heat storage, pressurized water, or any other suitable thermal storage fluid/liquid and/or coolant, may be employed as the sensible thermal storage medium. Optionally, such systems may be configured so that the thermal storage liquid remains liquid while the system 10A or 10B is in use and does not undergo a meaningful phase change (i.e. does not boil to become a gas). This may help reduce the loss of thermal energy via the phase change process. For example, such thermal storage liquids (e.g. water) may be pressurized and maintained at an operating pressure that is sufficient to generally keep the water in its liquid phase during the heat absorption process as its temperature rises. That is, the reservoir and/or conduits containing a thermal storage liquid can be pressurized to a pressure that is greater than atmospheric pressure, and optionally may be at least between about 10 and 60 bar, and may be between about 30 and 45 bar, and between about 20 and 26 bar, so that the thermal storage liquid can be heated to a temperature that is greater than its boiling temperature at atmospheric pressure.

In some embodiments, the pressure within the thermal storage subsystem 120 may be approximately the same as the pressure of the gas layer 14 within the accumulator 12. This may allow the gas that is being stored within the accumulator 12 to also be used to pressurize at least some portions of the thermal storage subsystem 120. In some arrangements, there may be fluid communication between the gas layer 14 and aspects of the thermal storage subsystem 120 to help facilitate such pressurization. Optionally, the fluid communication between the gas layer 14 and portions of the thermal storage subsystem 120 may be sufficiently open and/or free (i.e. without substantial flow impediments) such that gas can flow relatively freely between the accumulator 12 and at least portions of the thermal storage subsystem 120 as the system 10 is in use and as pressure changes within the accumulator 12. This exchange of gas may help facilitate an automatic balancing and/or matching of the pressures between the gas layer 14 and the pressurized portions of the thermal storage subsystem 120.

Optionally, the pressurized water may be passed through a heat exchanger or series of heat exchangers to capture and return the heat to and from the gas stream that is exiting the accumulator, via conduit 22. Generally, sensible heat storage may be useful for storing heat of temperatures of 100 degrees Celsius and higher. Pressurizing the water in these systems may help facilitate heating the water to temperatures well above 100 degrees Celsius (thereby increasing its total energy storage capability) without boiling.

Optionally, in some embodiments, a thermal storage subsystem 120 may combine both latent and sensible heat storage stages and may use phase change materials with multiple stages or a single stage. Preferably, particularly for phase change materials, the number of stages through which air is conveyed during compression and expansion may be adjustable by controller 118. This may help the system 10 to adapt its thermal storage and release programme to match desired and/or required operating conditions.

Optionally, at least some of the gas conduit 22 may be external the shaft 18 so that it is not submerged in the water 20 that is held in the shaft 18. In some preferred embodiments, the compressed gas stream will transfer its thermal energy to the thermal storage system 120 (for example by passing through heat exchangers 635 described herein) before the compressed gas travels underground. That is, some portions of the thermal storage subsystem 120 and at least the portion of the gas conduit that extends between the compressor/expander subsystem 100 and the thermal storage subsystem 120 may be provided above ground, as it may be generally desirable in some embodiments to transfer as much excess heat from the gas to the thermal storage subsystem 120, and reduce the likelihood of heat being transferred/lost in the water 20, ground or other possible heat sinks along the length of the gas conduit 22. Similar considerations can apply during the expansion stage, as it may be desirable for the warmed gas to travel from the thermal storage subsystem 120 to the compressor/expander subsystem 100 at a desired temperature, while reducing the heat lost in transit.

Referring again to FIG. 3, in this example the thermal storage subsystem 120 is configured to store thermal energy from the incoming pressurized gas in a thermal storage liquid 600. Optionally, the thermal storage liquid 600 can be pressurized in the thermal storage subsystem 120 to a storage pressure that is higher than atmospheric pressure and may optionally be generally equal to or greater than the accumulator pressure. Harmonizing the storage pressure in the thermal storage subsystem 120 and the accumulator 12 may help facilitate configurations in which there is at least some fluid communication between the thermal storage subsystem 120 and the accumulator 12 (including those described herein). In some examples, the storage pressure may be between about 100% and about 200% of the accumulator pressure.

Pressurizing the thermal storage liquid 600 in this manner may allow the thermal storage liquid 600 to be heated to relatively higher temperatures (i.e. store relatively more thermal energy and at a more valuable grade) without boiling, as compared to the same liquid at atmospheric pressure. That is, the thermal storage liquid 600 may be pressurized to a storage pressure and heated to a thermal storage temperature such that the thermal storage liquid 600 is maintained as a liquid while the system is in use (which may help reduce energy loss through phase change of the thermal storage liquid). In the embodiments illustrated, the storage temperature may be between about 150 and about 500 degrees Celsius, and preferably may be between about 150 and 350 degrees Celsius. The storage temperature is preferably below a boiling temperature of the thermal storage liquid 600 when at the storage pressure but may be, and in some instances preferably will be the above boiling temperature of the thermal storage liquid 600 if it were at atmospheric pressure. In this example, the thermal storage liquid 600 can be water, but in other embodiments may be engineered heat transfer/storage fluids, coolants, oils and the like. When sufficiently pressurized, water may be heated to a storage temperature of about 250 degrees Celsius without boiling, whereas water at that temperature would boil at atmospheric pressure.

Optionally, the thermal storage liquid 600 can be circulated through a suitable heat exchanger to receive heat from the compressed gas stream travelling through the gas supply conduit 22 during a charging mode (downstream from the compressor/expander subsystem 100). The heated thermal storage liquid 600 can then be collected and stored in a suitable storage reservoir (or more than one storage reservoirs) that can retain the heated thermal storage liquid 600 and can be pressurized to a storage pressure that is greater than atmospheric pressure (and may be between about 10 and 60 bar, and may be between about 30 and 45 bar, and between about 20 and 26 bar).

The storage reservoir may be any suitable type of structure, including an underground chamber/cavity (e.g. formed within the surrounding ground 200) or a fabricated tank, container, a combination of a fabricated tank and underground chamber/cavity, or the like. If configured to include an underground chamber, the chamber may optionally be lined to help provide a desired level of liquid and gas impermeability and/or thermal insulation. For example, underground chambers may be at least partially lined with concrete, polymers, rubber, plastics, geotextiles, composite materials, metal and the like. Configuring the storage reservoir to be at least partially, and preferably at least substantially impermeable may help facilitate pressurizing the storage reservoir as described herein. Preferably, the underground chamber may be a repurposed or reconfigured structure that was previously used for another purpose during the construction or operation of the system 10. For example, a thermal storage reservoir may be provided in the interior of a construction shaft or decline or other such structure that was used for a non-thermal storage related purpose during the construction of the system 10.

Fabricated tanks may be formed from any suitable material, including concrete, metal, plastic, glass, ceramic, composite materials and the like. Optionally, the fabricated tank may include concrete that is reinforced using, metal, fiber reinforced plastic, ceramic, glass or the like, which may help reduce the thermal expansion difference between the concrete and the reinforcement material.

In this embodiment the storage reservoir 610 of the thermal storage subsystem 120 includes a chamber 615 that is positioned underground, at a reservoir depth 660. Optionally, the reservoir depth 660 is less than the depth of the accumulator 12, which in this example corresponds to the shaft height 50. Optionally, the thermal storage subsystem 120 can be configured so that the reservoir depth 660 is at least about ⅓ of the accumulator depth/shaft height 50, or more. For example, if the accumulator 12 is at a depth of about 300 m, the reservoir depth 660 is preferably about 100 m or more. For example, having the reservoir depth 660 being less than the accumulator depth 50 may help facilitate sufficient net positive suction head to be available to the fluid transfer pumps and other equipment utilized to pump the thermal storage liquid 600 through the thermal storage subsystem 120 (for example between source reservoir 606 and storage reservoir 610). This may allow the transfer pumps to be positioned conveniently above ground and may help reduce the chances of damaging cavitation from occurring. In other embodiments, the reservoir depth 660 may be substantially the same as the shaft height 50.

The reservoir depth 660 being at least ⅓ the depth 50 of the accumulator 12 may also allow for relatively higher rock stability of the subterranean thermal storage cavern, such as chamber 615. The geostatic gradient, which provides an upper limit on pressure inside underground rock caverns, is typically about 2.5-3 times the hydrostatic gradient. Given this rock stability criterion, the shallowest reservoir depth 660 may be approximately three times less than the accumulator depth in some embodiments, such as when the storage pressure is generally equal than the accumulator pressure.

In this example, the chamber 615 is a single chamber having a chamber interior 616 that is at least partially defined by a bottom chamber wall 620, a top chamber wall 651, and a chamber sidewall 621. The chamber 615 is connected to one end of a liquid inlet/outlet passage 630 (such as a pipe or other suitable conduit) whereby the thermal storage liquid 600 can be transferred into and/or out of the chamber 615. In addition to the layer of thermal storage liquid 600, a layer of cover gas 602 is contained in the chamber 615 and overlies the thermal storage liquid 600. Like the arrangement used for the accumulator 12, the layer of cover gas 602 can be pressurized using any suitable mechanism to help pressurize the interior of the chamber 615 and thereby help pressurize the thermal storage liquid 600. The cover gas may be any suitable gas, including air, nitrogen, thermal storage liquid vapour, an inert gas and the like. Optionally, at least the subterranean portions of the liquid inlet/outlet passage 630 (i.e. the portions extending between the heat exchanger 635 and the storage reservoir 610) may be insulated (such as by a vacuum sleeve, or insulation material) to help reduce heat transfer between the thermal storage fluid and the surrounding ground.

When the thermal storage subsystem 120 is in use, a supply of thermal storage liquid can be provided from any suitable thermal storage liquid source 605. The thermal storage liquid source can be maintained at a source pressure that may be the same as the storage pressure or may be different than the storage pressure. For example, the thermal storage liquid source may be at approximately atmospheric pressure, which may reduce the need for providing a relatively strong, pressure vessel for the thermal storage liquid source. Alternatively, the thermal storage liquid source may be pressurized. The thermal storage liquid source may also be maintained at a source temperature that is lower, and optionally substantially lower than the storage temperature. For example, the thermal storage liquid source may be at temperatures of between about 2 and about 100 degrees Celsius and may be between about 4 and about 50 degrees Celsius. Increasing the temperature difference between the incoming thermal storage liquid from the source and the storage temperature may help increase the amount of heat and/or thermal energy that can be stored in the thermal storage subsystem 120.

The thermal storage liquid source 605 may have any suitable configuration and may have the same construction as an associated storage reservoir or may have a different configuration. For example, in the embodiment of FIG. 3 the thermal storage liquid source 605 includes a source reservoir 606 that is configured in the same underground chamber as the thermal fluid storage chamber 615. In this arrangement, a closed loop system can be provided, including the storage reservoir 610 and the source reservoir 606. Alternatively, the thermal storage liquid source 605 may include a source reservoir 606 that is configured as an above-ground vessel, and optionally need not be pressurized substantially above atmospheric pressure. In other embodiments, the thermal liquid source 605 may include a body of water such as the lake 150, water 20 from the shaft 18, liquid from the liquid layer 16 in the accumulator 12 (or from any other portion of the overall system 10), water from a municipal water supply or other such sources and combinations thereof.

In the embodiment of FIG. 3, the source reservoir 606 and storage reservoir 610 are adjacent each other and are portions of a generally common underground chamber. This may help simplify construction of the thermal storage subsystem 120 as an excavation of a single chamber may provide space for both the source reservoir 606 and storage reservoir 610. This may also help simplify piping and valving between the source reservoir 606 and the storage reservoir 610.

In some examples, the interiors of the storage reservoir 610 and source reservoir 606 may be substantially fluidly isolated from each other, such that neither gas nor liquid can easily/freely pass between reservoirs 606 and 610. Alternatively, as illustrated in Figure, the interiors of the storage reservoir 610 and source reservoir 606 may be in gas flow communication with each other, such as by providing the gas exchange passage 626 that can connect the layer of cover gas 602 with a layer of cover gas 608 in the source reservoir 606. The gas exchange passage 626 can be configured to allow free, two-way flow of gas between the storage reservoir 610 and the source reservoir 606 or may be configured to only allow one-way gas flow (in either direction). Providing a free flow of gas between the storage reservoir 610 and the source reservoir 606 may help automatically match the pressures within the storage reservoir 610 and the source reservoir 606. Preferably, when arranged in this manner, the interior of the storage reservoir 610 remains at least partially isolated from the interior of the source reservoir 606 during normal operation to inhibit, and preferably prevent mixing of the relatively hot cover gas associated with the thermal storage liquid 600 in the storage reservoir 610 with the relatively cooler cover gas associated with the thermal storage liquid in the source reservoir 606. In this example, the storage reservoir 610 and source reservoir 606 share a common sidewall, which can function as an isolating barrier 625 to prevent liquid mixing between the reservoirs. This common sidewall may be insulated to prevent unwanted heat transfer from the relatively hot thermal storage liquid 600 in the storage reservoir 610 to the relatively cooler thermal storage liquid in the source reservoir 606

When the compressed gas energy storage systems are in a charging mode, compressed gas is being directed into the accumulator 12 and the thermal storage liquid 600 can be drawn from the thermal storage liquid source 605, passed through one side of a suitable heat exchanger 635 (including one or more heat exchanger stages) to receive thermal energy from the compressed gas stream exiting the compressor/expander subsystem 100, and then conveyed/pumped through the liquid inlet/outlet passage 630 and into the storage reservoir 610 for storage at the storage pressure.

When the compressed gas energy storage system is in a storage mode, compressed gas is neither flowing into or out of the accumulator 12 or thorough the heat exchanger 635, and the thermal storage liquid 600 need not be circulated through the heat exchanger 635.

When the compressed gas energy storage systems are in a discharging mode, compressed gas is being transferred from the accumulator 12 and into the compressor/expander subsystem 120 for expansion and the thermal storage liquid 600 can be drawn from the storage reservoir 610, passed through one side of a suitable heat exchanger 635 (including one or more heat exchanger stages) to transfer thermal energy from thermal storage liquid into the compressed gas stream to help increase the temperature of the gas stream before it enters the compressor/expander subsystem 100. Optionally, the thermal storage fluid can then be conveyed/pumped into the source reservoir 606 for storage.

The thermal storage liquid 600 can be conveyed through the various portions of the thermal storage subsystem 120 using any suitable combination of pumps, valves, flow control mechanisms and the like. Optionally, an extraction pump may be provided in fluid communication with, and optionally at least partially nested within, the storage reservoir 610 to help pump the thermal storage liquid 600 from the storage reservoir 610 up to the surface. Such a pump may be a submersible type pump and/or may be configured so that the pump and its driving motor are both located within the storage reservoir 610. Alternatively, the pump may be configured as a progressive cavity pump having a stator and rotor assembly 668 (including a rotor rotatably received within a stator) provided in the storage reservoir 610 and positioned to be at least partially submerged in the thermal storage liquid 600, a motor 670 that is spaced from the stator and rotor assembly 668 (on the surface in this example) and a drive shaft 672 extending therebetween. In this example, the drive shaft 672 is nested within the liquid inlet/outlet passage 630 extending to the storage reservoir 610, but alternatively may be in other locations.

Optionally, to help pressurize the storage reservoir 610, the thermal storage subsystem 120 may include any suitable type of pressurization system and may include a thermal storage compressor system that can help pressurize the layer of cover gas 602 in the storage reservoir. This may include a thermal storage compressor 664 that is in fluid communication with the cover gas layer. The compressor itself may be on the surface and may be connected to the cover gas layer by a compressor gas conduit 666 that may be spaced from, or at least partially integrated with the liquid inlet/outlet passage 630. Optionally, the compressor 664 may be configured to raise the pressure of the cover gas layer 602 from atmospheric pressure to the storage pressure. The compressor 664, and any other aspects of the thermal storage subsystem 120 may be controlled at least partially automatically by the controller 118. While shown as a separate compressor 664, pressure for the storage reservoir 610 may at least partially be provided by the compressor/expander subsystem 100.

Figure 4:
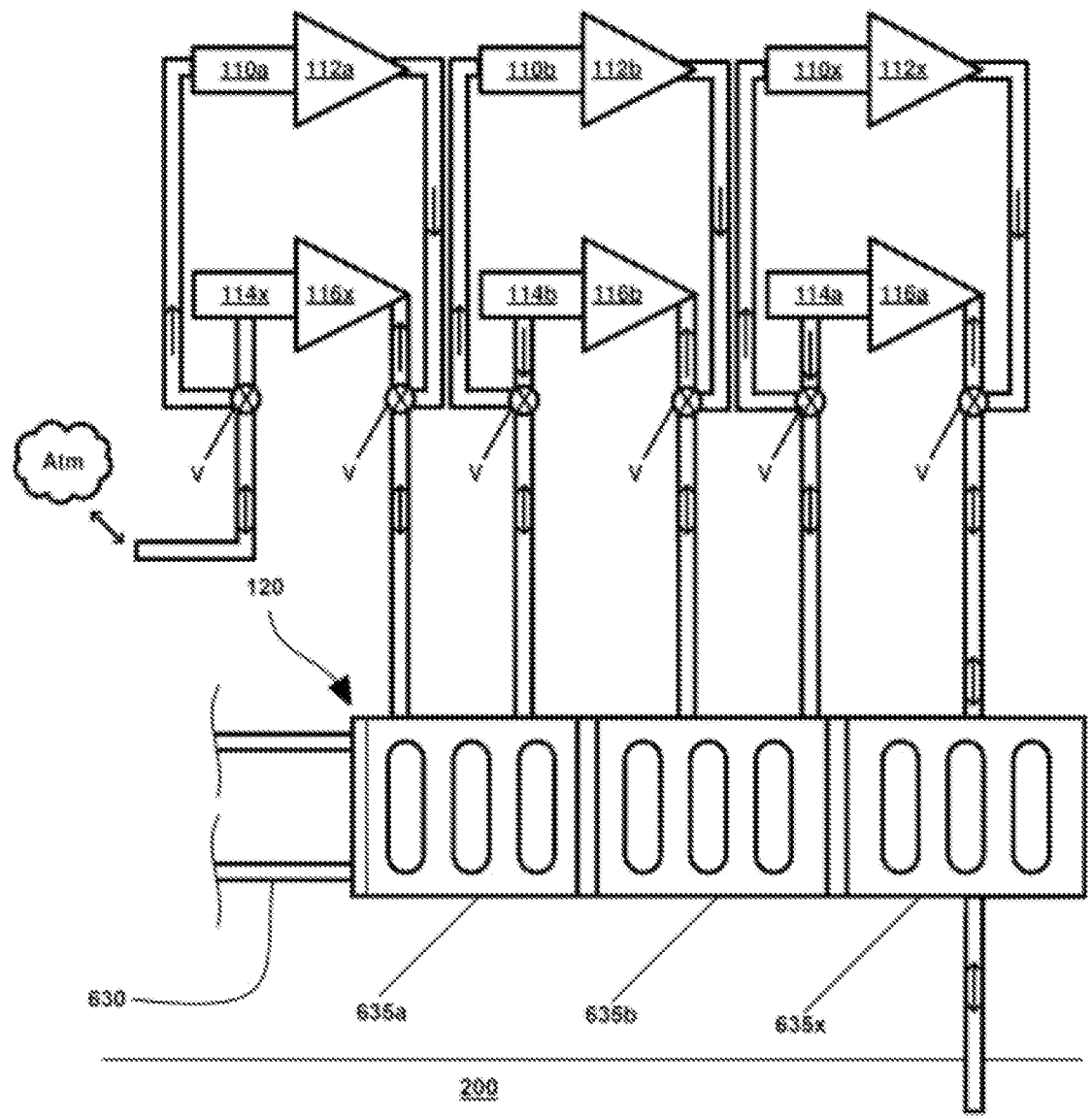
FIG. 4 is a schematic view of components of an alternative compressor/expander subsystem for a compressed gas energy storage system, with pairs of compression and expansion stages each associated with a respective stage of a thermal storage subsystem.

FIG. 4 is a schematic view of components of on example of a compressor/expander subsystem for use with a suitable compressed gas energy storage system (including the hydrostatically compensated systems described herein and other systems that are not hydrostatically compensated), with pairs of compression and expansion stages each associated with a respective heat exchanger of the thermal storage subsystem 120.

In this embodiment, a given exchanger of the thermal storage subsystem 120 is used during both the compression and expansion stages, by routing air being conveyed into the accumulator 12 through the thermal storage subsystem 120 to remove heat from the air either prior to a subsequent stage of compression or prior to storage, and routing air being conveyed out of accumulator 12 through the thermal storage subsystem 120 to add heat to the air either after release from accumulator or after a stage of expansion. In a sense, therefore, pairs of compression and expansion stages share a heat exchanger 635a, 635b and 635x and airflow is controlled using valves V, as shown in FIG. 4. This embodiment may be useful where the "same" heat/thermal energy received from the compressed air being conveyed through the air flow path towards the accumulator 12 during a storage phase is intended to be reintroduced and/or transferred into the air being released from the accumulator 12 during a release phase.

The embodiment of FIG. 4 has a first heat exchanger 635a provided in the gas flow path and operable to transfer thermal energy between the compressed gas travelling through the gas flow path and the thermal storage liquid. A further second heat exchanger 635b is provided in the gas flow path downstream from the first heat exchanger and operable to transfer thermal energy between the compressed gas travelling through the gas flow path and the thermal storage liquid. For clarity, downstream refers to the path of compressed gas in charging mode. A further third heat exchanger 635x is provided in the gas flow path downstream from the second heat exchanger and operable to transfer thermal energy between the compressed gas travelling through the gas flow path and the thermal storage liquid.

Usage of multiple heat exchangers may allow the system to operate under desirable conditions. Since there are multiple stages of heat exchangers in this arrangement, no single heat exchanger needs to be responsible for capturing all the thermal energy from the compressed gas. Instead, there are multiple opportunities for the thermal energy in the compressed gas to be transferred to the thermal storage media. The thermal storage media can therefore be kept at a lower temperature, which may reduce the pressure to which the thermal storage liquid needs to be pressurized to maintain its liquid state, may optionally eliminate the need to pressurize the thermal storage liquid generally above atmospheric pressure and/or may help reduce the need for thermal insulative material in the thermal storage reservoir or other portions of the thermal storage subsystem 120.

Similarly, in the discharging mode, the gas exiting the accumulator may receive thermal energy from the thermal storage media at each of the heat exchangers. The additional heat exchangers may help improve the overall efficiency of the thermal energy transfer back to the gas.

Figure 5:
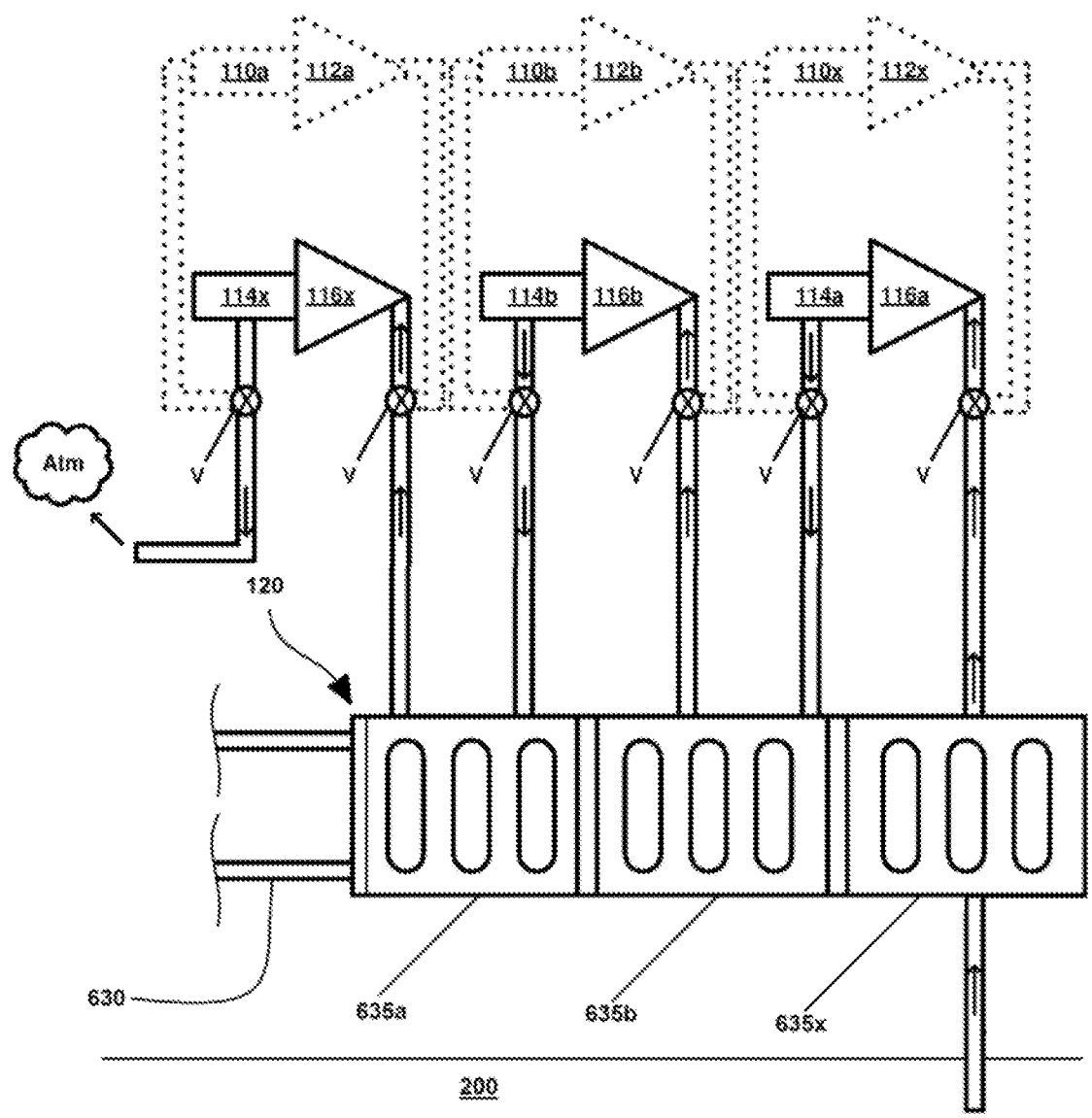
FIG. 5 is a schematic view of components of the alternative compressor/expander subsystem of FIG. 4, showing airflow during an expansion (discharging) phase from storage through multiple expanders and respective stages of a thermal storage subsystem.

FIG. 5 is a schematic view of components of the alternative example of a compressor/expander subsystem, showing airflow during an expansion (release) phase from storage through multiple expander stages and multiple respective heat exchangers of the thermal storage subsystem 120. In this phase, through control of valves V, airflow is directed through multiple expansion. The dashed lines show multiple compression stages the airflow to which is prevented during an expansion phase by the control of valves V.

Figure 6:
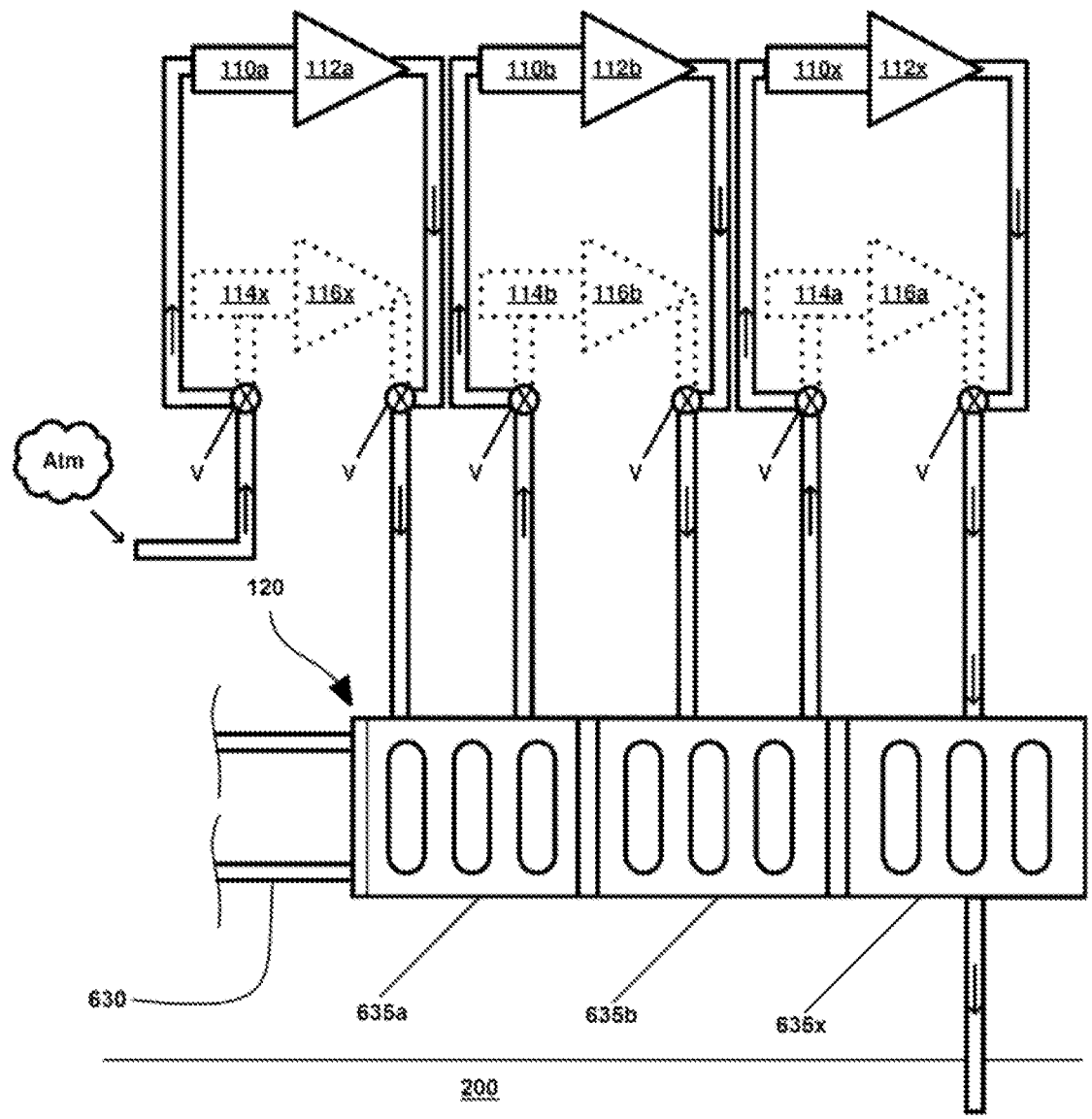
FIG. 6 is a schematic view of components of the alternative compressor/expander subsystem of FIG. 4, showing airflow during a compression (charging) phase from the ambient through multiple compressors and respective stages of a thermal storage subsystem.

FIG. 6 is a schematic view of components of the alternative compressor/expander subsystem of FIG. 4, showing airflow during a compression (storage) phase from the ambient A through multiple compressor stages and multiple respective heat exchangers of the thermal storage subsystem 120. In this phase, through control of valves V, airflow is directed through multiple compression stages. The dashed lines show multiple expansion stages the airflow to which is prevented during the compression phase by the control of valves V.

Figure 7:
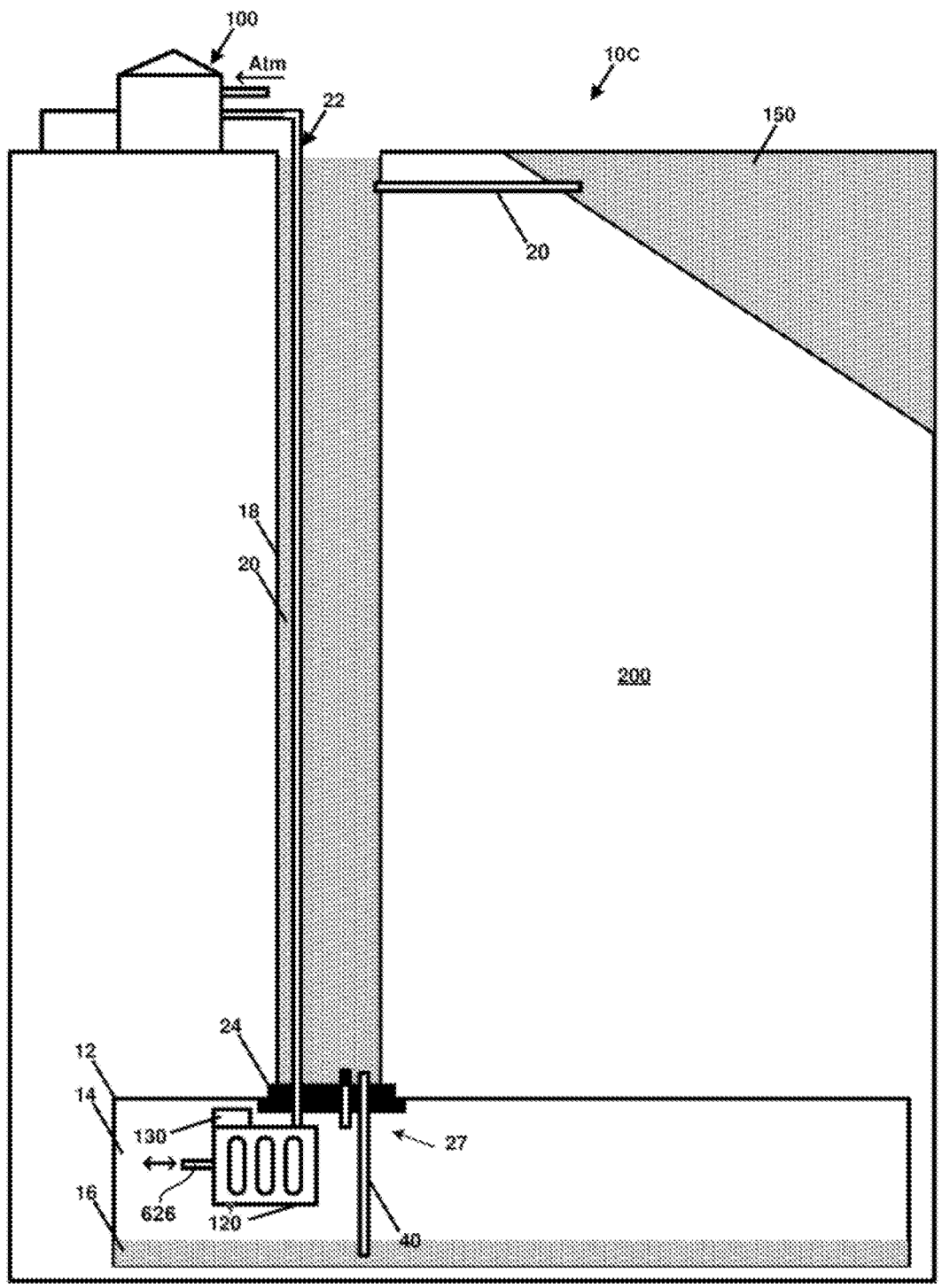
FIG. 7 is a sectional view of components of a compressed gas energy storage system, according to an alternative embodiment.

FIG. 7 is a sectional view of components of an alternative compressed gas energy storage system 10C, according to an embodiment. In this embodiment, compressed gas energy storage system 10C is similar to the other embodiments of the compressed gas energy storage systems described herein. However, in this embodiment the thermal storage subsystem 120 (including any of the suitable variations described herein, including a storage reservoir 610, source reservoir 606 and related equipment) is located within the accumulator 12 and may be at least partially immersed within the compressed gas in compressed gas layer 14. The thermal storage subsystem 120 may be positioned within the accumulator 12 during construction via the opening 27 that is thereafter blocked with bulkhead 24 prior to filling shaft 18 with liquid 20. The thermal storage subsystem 120 can thus be designed to allow for the construction, insulation, etc. to be completed prior to placement within the accumulator 12 and/or is constructed in easily-assembled components within the accumulator 12. This allows for the units to be highly insulated and quality-controlled in their construction, which enables the thermal storage subsystem 120 to be generally independent of the accumulator 12, with the exception of an anchoring support (not shown).

Optionally, a regulating valve 130 associated with the interior of thermal storage subsystem 120 may be provided and configured to open should the pressure within the thermal storage subsystem 120 become greater than the designed pressure-differential between its interior and the pressure of the compressed gas layer 14 in the surrounding accumulator 12. Pressure within the thermal storage subsystem 120 may be maintained at a particular level for preferred operation of the latent or sensible material. For example, heated water as a sensible material may be maintained at a particular pressure to maintain the thermal fluid in its liquid state at the storage temperature. The regulating valve 130 may open to allow the pressurized gas in the interior to escape to the accumulator 12 and can close once the pressure differential is lowered enough to reach a designated level. In an alternative embodiment, such a regulating valve may provide fluid communication between the interior of the thermal storage subsystem 120 and the ambient A at the surface thereby to allow gas to escape to the ambient rather than into the accumulator 12. While thermal storage subsystem 120 is shown entirely immersed in the compressed gas layer 14, alternative thermal storage subsystems 120 may be configured to be immersed partly or entirely within liquid layer 16. In some examples, only a portion of the thermal storage subsystem 120, such as the storage reservoir 610, may be at least partially nested within the accumulator 12, and other portions, such as the heat exchangers and the source reservoir 606, may be spaced apart from the accumulator 12.

Figure 8:
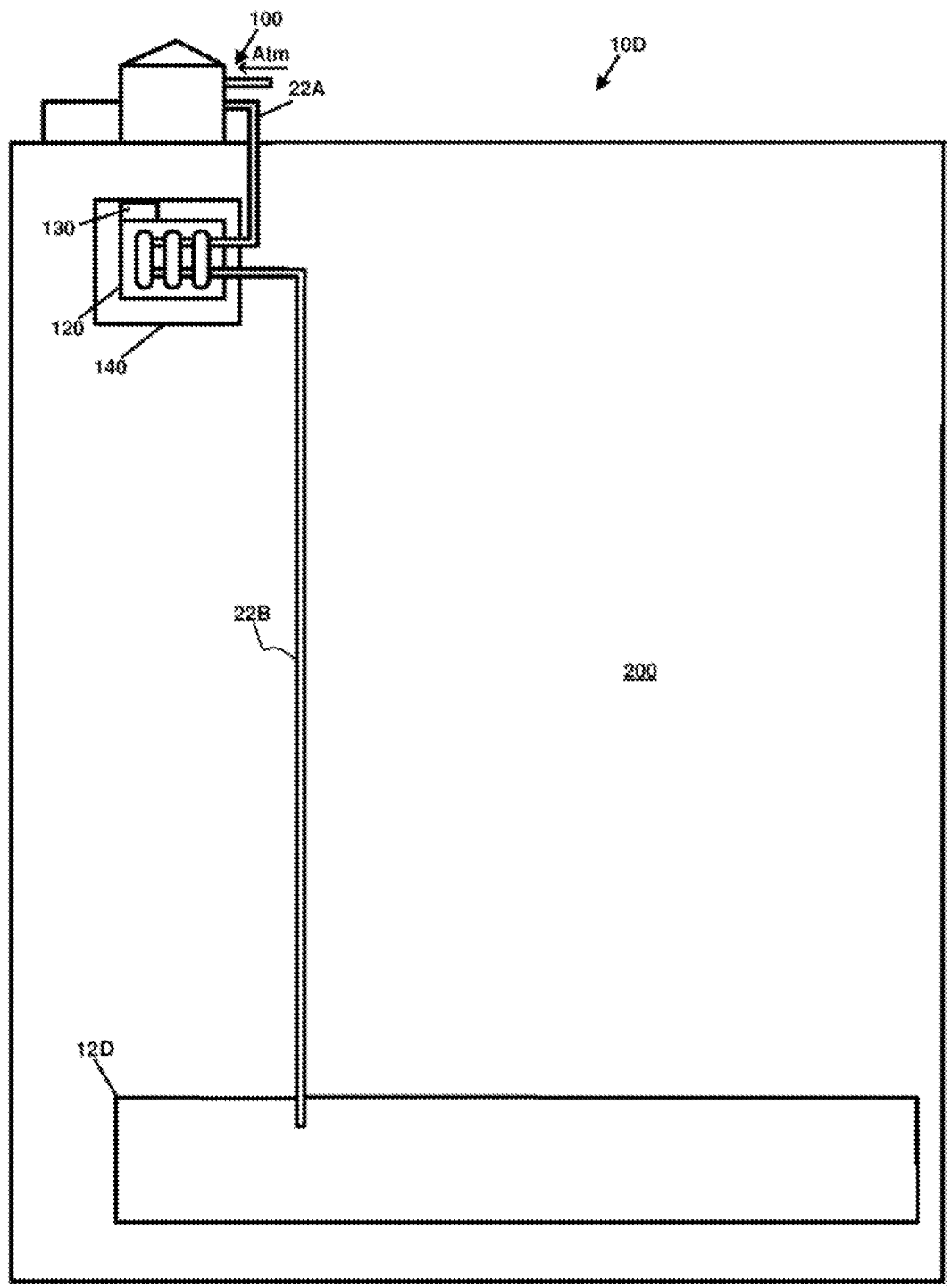
FIG. 8 is a sectional view of components of an alternative compressed gas energy storage system, according to another alternative embodiment.

FIG. 8 is a sectional view of components of an alternative compressed gas energy storage system 10D, according to another alternative embodiment. In this embodiment, the compressed energy gas storage system 10D includes a different type of accumulator 12D that is not hydrostatically compensated, and may be a salt cavern, an existing geological formation, or manmade. That is, the accumulator 12D is configured to contain compressed gas but need not include a liquid layer or be associated with a shaft containing water. This is another type of accumulator that may, in some embodiments, be used in place of or in addition to the accumulators 12 used with respect to other embodiments of the compressed gas energy storage systems described herein. Aspects of the thermal storage subsystems 120 described in this embodiment may be used in combination with the hydrostatically compensated compressed gas energy storage systems described, and aspects of the thermal storage subsystems 120 depicted in other embodiments may be utilized with accumulators similar to accumulator 12D. In this embodiment, compressed gas energy storage system 10D is similar to above-described compressed gas energy storage systems. However, the thermal storage subsystem 120 is located within an isobaric pressurized chamber 140 within ground 200 that may be maintained at the same pressure as is accumulator 12, or a pressure that is substantially similar to the accumulator pressure or optionally at a pressure that is less than or greater than the accumulator pressure. Optionally, the thermal storage subsystem 120 may be positioned within the pressurized chamber 140 during construction via an opening that is thereafter blocked so the chamber 140 may be pressurized to a working pressure that is, preferably, greater than atmospheric pressure. The thermal storage subsystem 120 can thus be designed to allow for the construction, insulation, etc. to be completed prior to placement within the chamber 140 and/or is constructed in easily-assembled components within the chamber 140. This allows for the units to be highly insulated and quality-controlled in their construction, which enables the thermal storage subsystem 120 to be generally independent of the chamber 140, with the exception of anchoring support (not shown). A regulating valve 130 associated with the interior of thermal storage subsystem 120 is provided and configured to open should the pressure within the thermal storage subsystem 120 become greater than the designed pressure-differential between the interior and the surrounding pressurized chamber 140. Pressure within the thermal storage subsystem 120 may be required to be maintained at a particular level for optimal operation of the latent or sensible material. For example, heated water as a sensible material may be required to be maintained at a particular pressure to maintain the thermal fluid in its liquid state at the storage temperature. The regulating valve 130 opens to allow the pressurized gas in the interior to escape to the pressurized chamber 140 and closes once the pressure differential is lowered enough to reach a designated level. In an alternative embodiment, such a regulating valve 130 may provide fluid communication between the interior of the thermal storage subsystem 120 and the ambient A at the surface thereby to allow gas to escape to the ambient rather than into the pressurized chamber 140.

Locating the thermal storage subsystem 120 above the accumulator 12, and thus physically closer to the compression/expansion subsystem 100, may help reduce the length of piping required, which may help reduce the costs of piping, installation and maintenance, as well as reduced fluid-transfer power requirements.

While the embodiment of compressed gas energy storage system 10D includes an isobaric pressurized chamber 140, alternatives are possible in which the chamber 140 is not strictly isobaric. Furthermore, in alternative embodiments the pressurized chamber 140 may be in fluid communication with gas layer 14 and thus can serve as a storage area for compressed gas being compressed by compressor/expander subsystem 100 along with accumulator 12. In this way, the pressure of the gas in which the thermal storage subsystem 120 is immersed can be maintained through the same expansions and compressions of gas being conveyed to and from the accumulator 12.

Optionally, any of the thermal storage subsystems 120 described herein may include a thermal conditioning system that can be used to regulate the temperature of the layer of cover gas 602 in the storage reservoir 610 and/or in the source reservoir 606. For example, the thermal conditioning system may include a fan cooler, heat exchanger, evaporator coils or other such equipment so that it can be used to optionally reduce (or alternatively increase) the temperature of the layer of cover gas 602 when the thermal storage subsystem 120 is in use.

In certain preferred embodiments, the thermal storage system 120 for use with a suitable compressed gas energy storage system may be configured to use a solid thermal storage media. The use of a solid thermal storage media may provide certain benefits. For example, a solid thermal storage media may allow for direct heat transfer between gas and the storage media without risk of mixing between the gas stream and the thermal storage media. Further, using a solid thermal storage media may help ensure that the thermal storage media will not change phase during heat transfer, which may help reduce and/or eliminate the need to pressurize the thermal storage media and its storage reservoirs while the systems 10 are in use. This may help simplify the construction and/or maintenance of the systems 10 and may reduce and/or eliminate the need to utilize relatively high-strength pressure vessels for either of the cold or hot storage reservoirs. The thermal storage media used may be any suitable type of granular heat transfer particles and may include, for example, rocks, gravel, metal (aluminum, steel, etc.) or any suitable granular solid (e.g., sand, silica, etc.).

Figure 9:
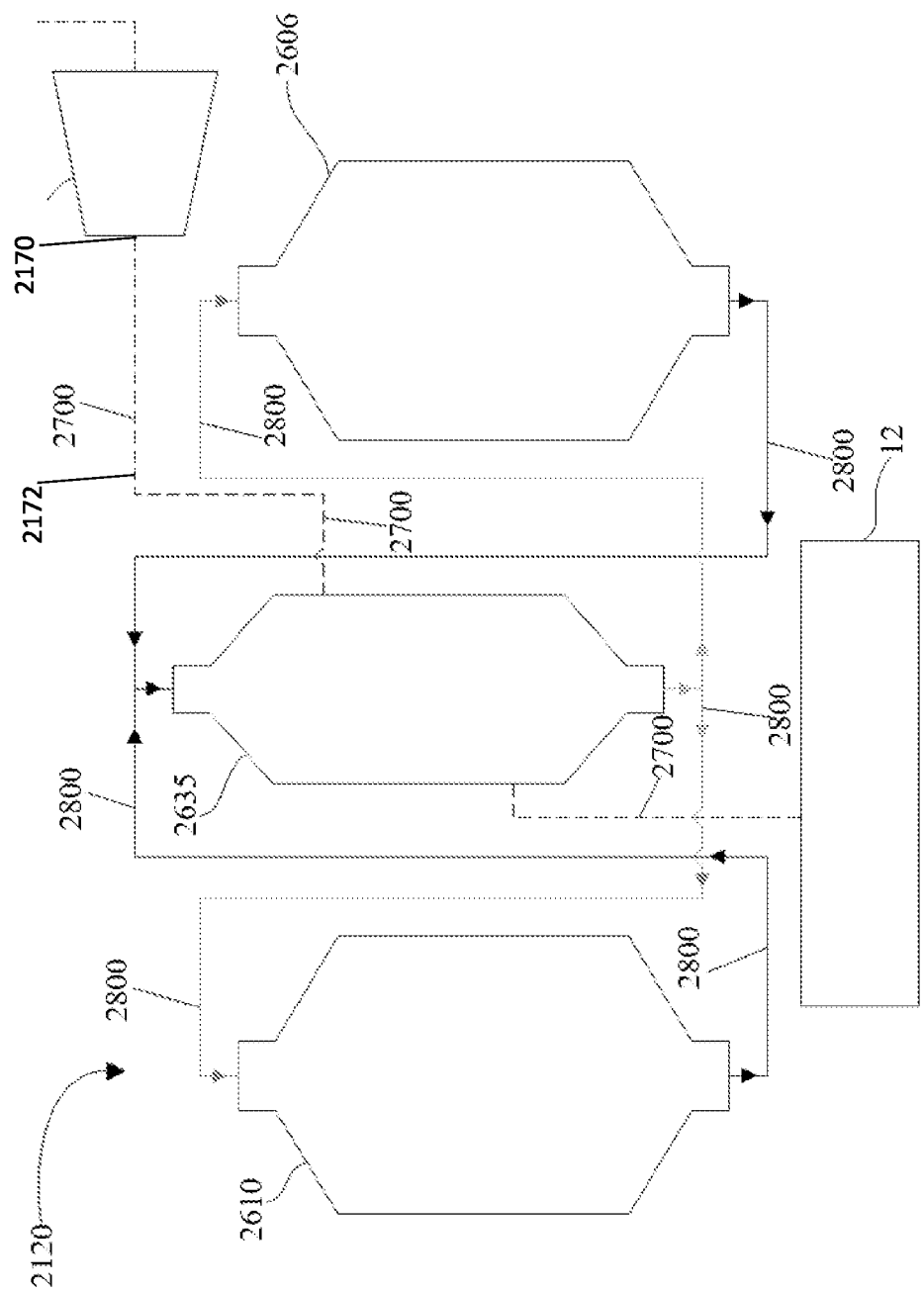
FIG. 9 is a schematic view of components of one embodiment of a thermal storage system for a compressed gas energy storage system, which uses a direct heat exchanger with a solid thermal storage media.

Referring to FIG. 9, an example of another embodiment of thermal storage subsystem 2120 is configured for use with a solid thermal storage media and may be used in combination with any of the systems 10 described herein and other suitable systems. This thermal storage subsystem 2120 may be used as the sole thermal storage subsystem for a compressed gas energy storage system or may be used in combination with other embodiments of thermal storage subsystems, including those described herein.

In this example, the thermal storage subsystem 2120 is configured to be used in combination with any suitable compressor/expander subsystem 2100 that includes at least one compression and expansion stage, including those compression and expansion subsystems 100 described herein. The compressor/expander subsystem 2100 may include any suitable or desired number of compression and/or expansion stages, and may have, for example 2, 3 or more compression and expansion stages. In such configurations, the compressor/expander subsystem 2100 can be understood to include at least a first gas inlet 2170 that can optionally be in communication with the atmosphere A and a gas outlet 2172 that is in fluid communication with the accumulator 12 interior via a gas flow path 2700 for conveying compressed gas at the storage pressure to the accumulator 12 when in the charging mode and from the accumulator 12 when in the discharging mode. For the purposes of discussing the operation of the thermal storage subsystem 2120 the gas outlet 2172 can be considered to be the final outlet from the compressor/expander subsystem 2100 at which the gas exiting the compressor/expander subsystem 2100 is at its final, and highest pressure that is substantially the same as the storage pressure within the accumulator 12 (subject to line losses, etc.). However, in some embodiments the gas outlet 2172 may be the outlet of one or more of the intermediary compression stages within a multi-stage compressor/expander subsystem, such that the pressure at the gas outlet is greater than the pressure at inlet 2170 but may be less than the pressure within the accumulator 12. In such examples, separate thermal storage subsystems 2120 may be used in combination with each compression stage or alternatively a thermal storage subsystem 2120 may be configured with multiple mixing chambers or other such features so as to be able to accommodate two or more gas streams at two or more pressures while preventing mixing of the streams with each other (thereby helping to preserve their separate pressures). In such examples, there may be one mixing chamber following each stage of compression, with the pressure in each mixing chamber substantially corresponding to the outlet pressure of the compression stage it is following.

In contrast to the thermal storage systems 120 the thermal storage media in the thermal storage subsystem 2120 utilizes a solid thermal storage media but it is still configured to transport/convey the thermal storage media between a relatively cool source reservoir and a relatively warm storage reservoir while the system 10 is in use. Instead of being liquid-containing tanks or caverns as used in the thermal storage systems 120 the thermal storage systems 2120 has a source reservoir that includes a cold storage chamber 2606 and a storage reservoir that includes a hot storage chamber 2610. A mixing chamber 2635 is provided in fluid communication with the gas flow path 2700 and is also connected in communication with the cold storage chamber 2606 and hot storage chamber 2610 as explained further herein.

This embodiment of the thermal storage subsystem 2120 may include at least a first mixing chamber 2635 (with two or more chambers possible in other embodiments) which may be configured to operate as a direct contact heat exchanger allowing the gas in the gas flow path to come into direct physical contact with the solid thermal storage media. In certain preferred embodiments, the first mixing chamber may be configured such that the pressure within the mixing chamber is substantially the same as the operating pressure within the gas flow path, and optionally at the desired storage pressure within the accumulator 12.

Figure 10A:
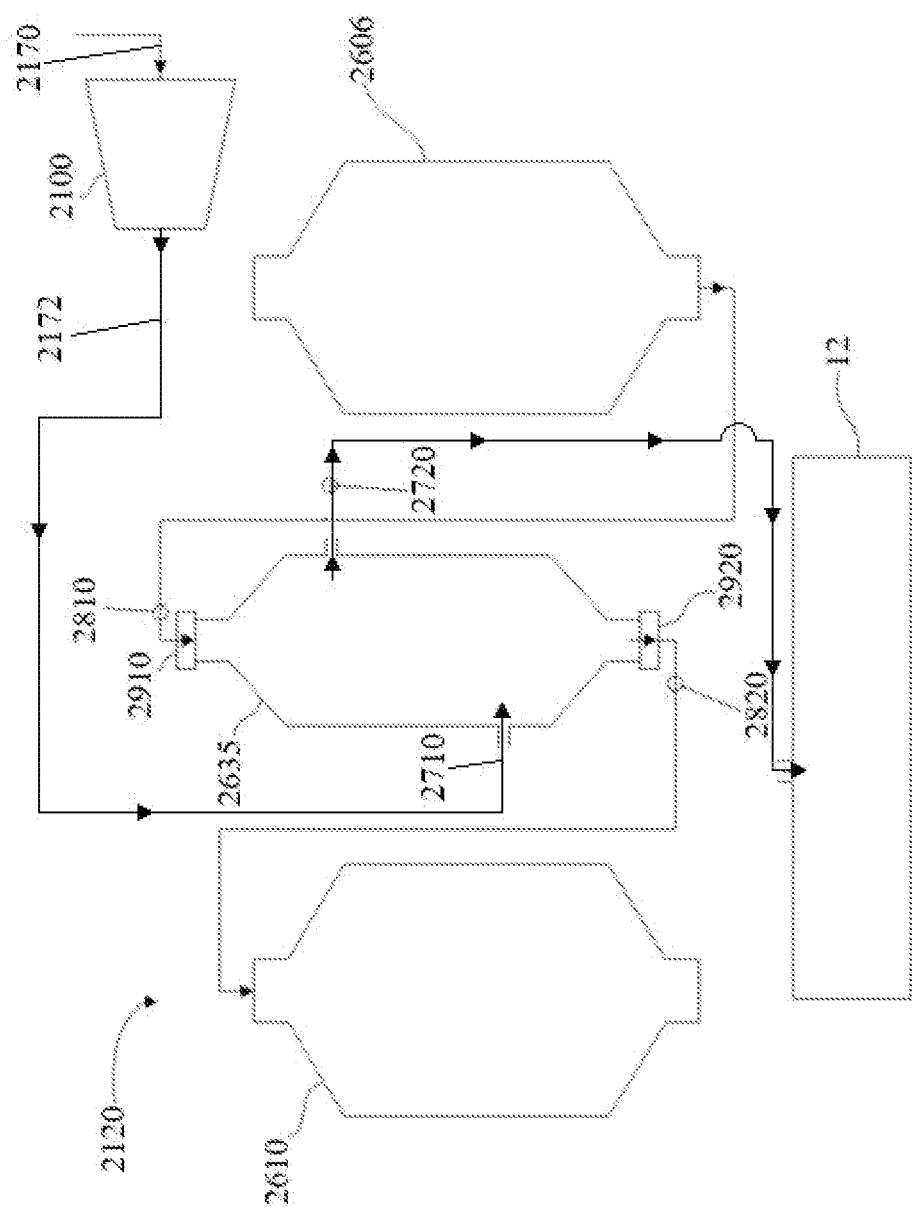
FIG. 10A is a schematic view of the components of the thermal storage system of FIG. 9 during a compression (charging) phase, which uses a direct heat exchanger with a solid thermal storage media.
Figure 10B:
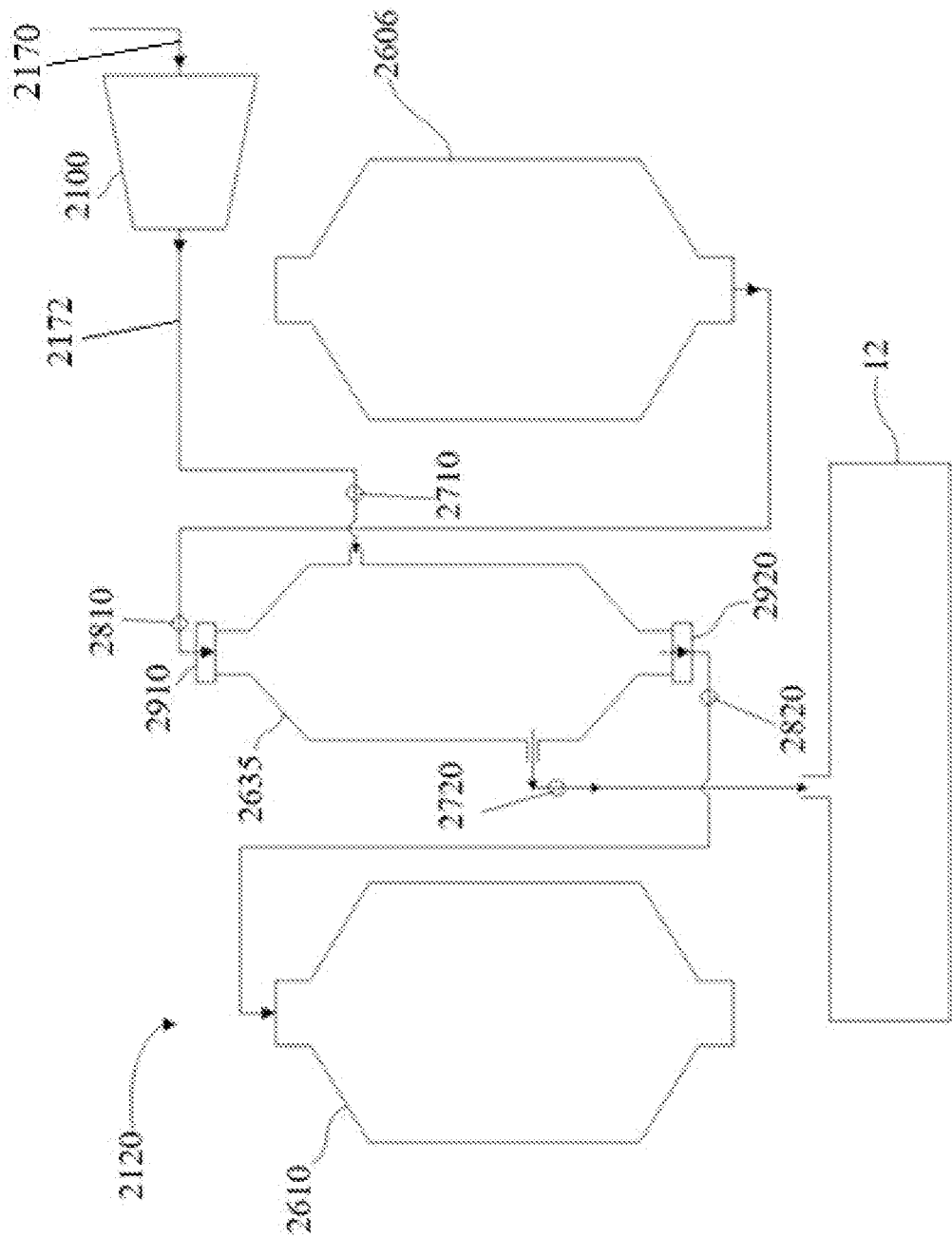
FIG. 10B is a schematic view of another arrangement of the components of the thermal storage system of FIG. 9 during a compression (charging) phase, which uses a direct heat exchanger with a solid thermal storage media.
Figure 11:
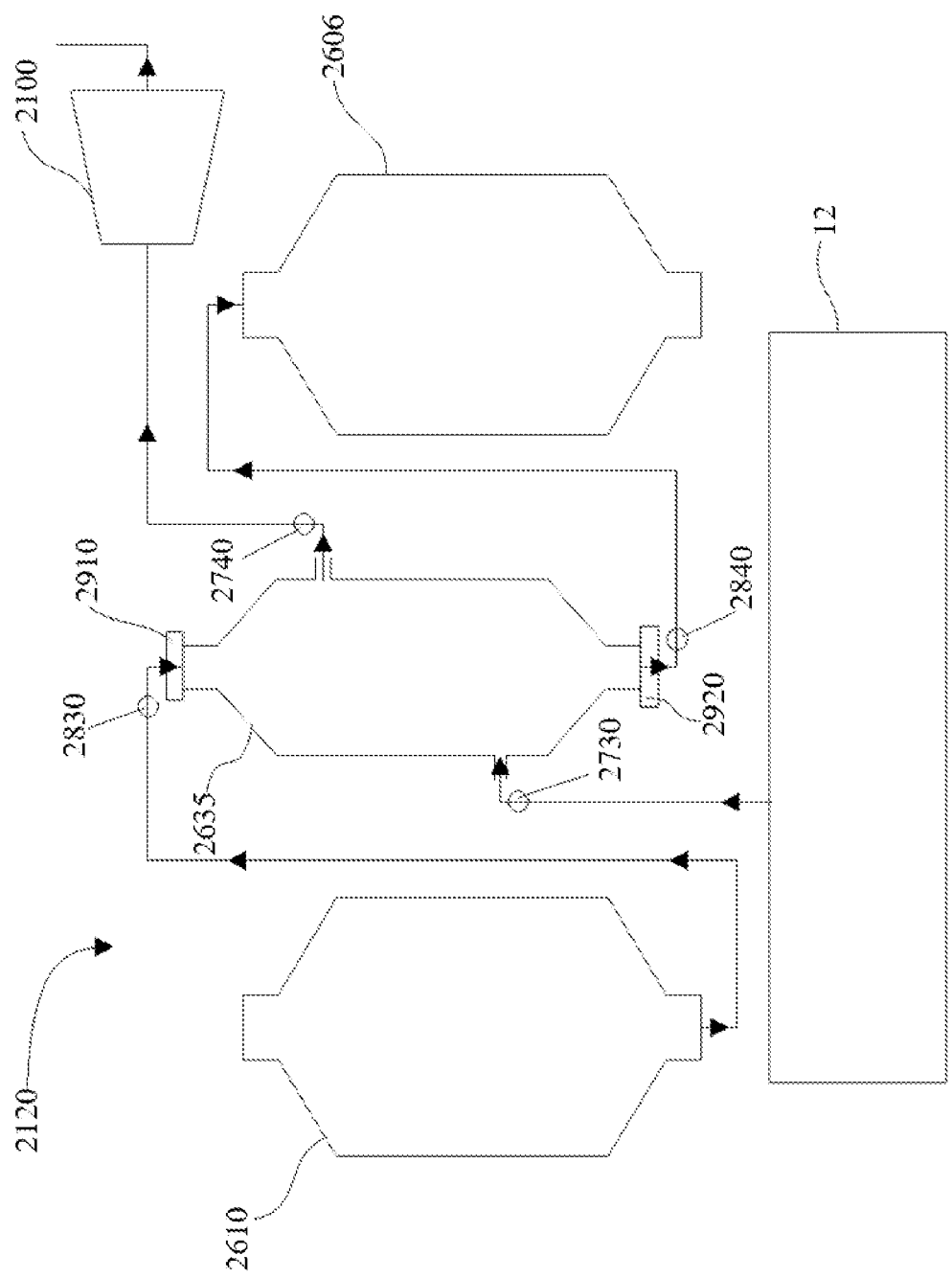
FIG. 11 is a schematic view of the components of the thermal storage system of FIG. 9 during an expansion (discharging) phase, which uses a direct heat exchanger with a solid thermal storage media.

The thermal storage subsystem 2120 may also include a variety of suitable valves, conduits, regulators and other equipment associated with the transmission of gas or solid particle matter streams but that have not been included in the schematic images of FIGS. 9-11.

Both the cold storage chamber 2606 and hot storage chamber 2610 include any suitable type of apparatus that can hold, receive and dispense the desired solid thermal storage media material, such as a silo, hopper, elevator and the like and may also include any suitable apparatus for handling and accessing the solid granular material, such as conveyors, hoppers, screw conveyors, positive displacements pumps, buckets and the like. For example, the cold storage chamber 2606 and hot storage chamber 2610 may each include at least one hopper-bottom silo that can allow the thermal storage media to be introduced via an inlet toward the top of the silo (for example using an inclined screw-conveyor) and extracted via an outlet at the bottom of the hopper section under the force of gravity. Some of these material handling apparatuses may also be included as part of a conveyance system as described herein.

In FIGS. 9-11 the cold storage chamber 2606 and hot storage chamber 2610 are both illustrated schematically as a single silo/chamber but may in practice include two or more separate chambers that can be accessed in unison or independently using the suitable material handling and conveying apparatuses. In certain preferred embodiments, the cold solid storage chamber 2606 and the hot solid storage chamber 2610 may be physically spaced apart and fluidly isolated from one another. This may help prevent heat transfer between the cold storage chamber 2606 and hot storage chamber 2610 when the system 10 is in use.

Each of the cold storage chamber 2606 and hot storage chamber 2610 can be sized (either as a single silo or two or more silos) to accommodate a desired overall quantity of the solid thermal storage media, which preferably is sufficient to absorb the overall amount of thermal energy that is desired to be extracted from the compressed gas as it flows from the compressor/expander subsystem 2100 and into the accumulator 12. This can allow at least substantially all of the solid thermal storage media to be stored within the cold storage chamber 2606 when the accumulator 12 is not charged (i.e. when substantially no pressurized air is being stored) and for at least substantially all of the solid thermal storage media to be stored within the hot storage chamber 2610 when the accumulator 12 is fully charged. When the system is operating in the charging or discharging mode, the overall quantity of the solid thermal storage media may be distributed between the two storage chambers 2606 and 2610 as well as within a mixing chamber 2635 as described herein. At some stages of operation of the systems 10, some of the granular, solid thermal storage media can be stored in the hot storage chamber 2610 having been previously heated, some can be in the process of being heated or cooled within the mixing chamber 2635 and some can be stored as cold thermal storage media in the cold storage chamber 2606. A given portion of the solid thermal storage media can also experience all three states over time, and may follow a use cycle in which it starts cold, is heated in the mixing chamber 2635 by gas entering the accumulator 12, is transferred to and stored in the hot storage chamber 2610, is returned to the mixing chamber 2635 and cooled by gas exiting the accumulator 12, and is returned as cooled material for storage in the cold storage chamber 2606.

Optionally, and preferably in some instances, the mixing chamber 2635 may have an interior that is sized to be smaller than either or both of the storage chambers 2606 and 2610 such that only a portion of the solid thermal storage media can be held within the mixing chamber 2635 at a given time.

In the illustrated example, the cold storage chamber 2606 is configured to contain the thermal storage media at a cold temperature and cold storage pressure, while the hot storage chamber 2610 is configured to contain the supply of granular heat transfer particles at a hot temperature and hot storage pressure.

As used in this description, the term cold temperature is intended to refer to a temperature that is relatively colder or lower than the temperature of the compressed gas that is exiting a respective compressions stage when in the charging mode, and also is relatively lower than the hot temperature(s) described herein. Providing the material at this relatively lower, cold temperature may then help facilitate a transfer of thermal energy out of the compressed gas and into the thermal storage material which can allow a cooling of the gas and optionally the storage/preservation of the thermal energy as described. In this way, cold temperature is understood to be a relative term and is not limited to a specific or absolute range of temperatures. Similarly, the term hot temperature is used to refer to a temperature that is hotter or higher than the expected temperature of the gas that will be passing through the thermal storage apparatus when in the discharge mode, and is relatively higher than the cold temperature. Providing the material at this relatively warmer or higher hot temperature can help facilitate the transfer of thermal energy form the thermal storage material into the gas as it is flowing through the thermals storage subsystem which may then help facilitate the warming of the gas. In this way, the hot temperature is understood to be a relative term and is not limited to a specific or absolute range of temperatures, although in most instances the hot temperature will be higher than the cold temperature for a given system. It is also preferred that the hot temperature is above the expected storage temperature of the gas within the accumulator.

For example, in some embodiments of the systems described herein the cold temperature may be cooler than the respective system's hot storage temperature, and may be approximately the same as an ambient environment or optionally may a temperature that is different than the ambient environmental temperature and/or may between about 10 degrees Celsius and about 40 degrees Celsius or more (e.g. optionally the same as the source reservoir 606), and the hot temperature may be between about 150 and about 500 degrees Celsius, and preferably may be between about 150 and 350 degrees Celsius (e.g. optionally the same as the storage reservoir 610) but may be hotter if desired as the risk of boiling/evaporation of the thermal storage media is reduced when using solid thermal storage particles (as compared to using a liquid thermal storage media).

The cold storage pressure may be any desirable pressure and preferably is approximately atmospheric pressure. This may reduce and/or eliminate the need to seal and pressurize the cold storage chamber 2606. The hot storage pressure may be any desirable pressure and preferably is also approximately atmospheric pressure. This may be facilitated by the use of the solid thermal storage media which does not require pressurization of the hot storage chamber 2610 in order to keep the heated thermal storage media in a desired physical state. This may reduce and/or eliminate the need to seal and pressurize the hot storage chamber 2610. The mixing pressure may optionally be greater than the cold storage pressure and/or the hot storage pressure and may be in some embodiments be substantially the same as the storage pressure of the accumulator (i.e. the pressure within the gas flow path). Alternatively, the mixing chamber 2635 may include suitable pressurization apparatus(es) that can alter its interior pressure independently of the pressure of the gas flow path.

By way of non-limiting example, the hot solid storage chamber 2610 may be configured to operate at less than about 10% of the pressure of the mixing chamber 2635. Preferably, the hot solid storage chamber 2610 may be configured to operate at or around atmospheric pressure. In certain embodiments, the cold solid storage chamber 2606 may be at a lower pressure than the mixing chamber 2635. By way of non-limiting example, the cold solid storage chamber 2606 may be configured to operate at less than about 10% of the pressure of the mixing chamber 2635.

When the thermal storage subsystem 2120 is in use, the solid thermal storage media is conveyed between the cold storage chamber 2606, hot storage chamber 2610 and mixing chamber 2635 as described herein, and accordingly the thermal storage subsystem 2120 preferably includes a suitable type of conveying system which may be operable to selectably move the granular heat transfer particles from the cold storage chamber, through the first mixing chamber and into the hot storage chamber, and vice versa. This may include conveyor belts, bucket conveyors, screw conveyors, hoppers, buckets and the like along with suitable motors, actuators, valves, flow limiting and directing devices and the like. For illustrative purposes, the flow path of the thermal storage media is shown schematically in FIG. 9-11 but features of the conveying system are not shown.

In this embodiment, when a given compressed air energy storage system is in its charging mode: i) granular heat transfer particles may be conveyed from the cold storage chamber 2606 into the first mixing chamber 2635, ii) thermal energy may be transferred to the granular heat transfer particles within the mixing chamber 2635 from the compressed gas stream 2700 being conveyed into the accumulator 12 via the first mixing chamber thereby heating the granular heat transfer particles and cooling the compressed gas, and iii) the heated granular heat transfer particles may be conveyed from the first mixing chamber 2635 to the hot storage chamber 2610 for storage. With a first portion of thermal storage particles warmed, a second portion of cold granular heat transfer particles can be taken from the cold storage chamber and conveyed into the interior of the mixing chamber 2635. The second portion of cold granular heat transfer particles can mix with the gas in the interior with the compressed gas traveling from the gas compressor/expander subsystem into the accumulator, thereby transferring thermal energy from the compressed gas to the second portion of cold granular heat transfer particles and providing a second portion of warmed granular heat transfer particles. The second portion of warmed granular heat transfer particles can then be moved from the interior of the mixing chamber 2635 into a hot storage chamber 2610. This process can be repeated for additional portions of the thermal storage media as it is withdrawn from the cold storage chamber 2606. Optionally, the time between moving additional portions of thermal storage media into the mixing chamber may be less than the residence time of thermal storage media in the mixing chamber, such that at least a fraction of the previous portion of thermal storage media is still present in the mixing chamber when then next portion of thermal storage media is introduced to the mixing chamber. Optionally, the time between moving additional portions of thermal storage media into the mixing chamber may be substantially less than the residence time of thermal storage media in the mixing chamber, such that multiple portions of thermal storage media is present in the mixing chamber at once.

The mixing chamber 2635, hot storage chamber 2610 and associated hot portions of the conveying system are preferably insulated to help reduce the heat loss from the stored, relatively hot thermal storage media and the surrounding environment. This thermal insulation may be any suitable type and is not shown in detail in the schematic figures.

Preferably, the thermal storage subsystem 2120 is configured so that only a portion of the thermal storage media is drawn from the cold storage chamber 2606 and moved into the mixing chamber 2635 at a given time, as compared to simply passing the hot gas stream through the entirety (or substantially the entirety) of the cold thermal storage media at the same time (for example, if the gas flow path were to be routed through the cold storage chamber 2606). In this arrangement, a first, smaller portion of cold thermal storage media is mixed with the incoming hot gas stream. This can help provide a relatively large temperature grade between the gas and the thermal storage media (i.e. a large difference in temperature between the gas entering the mixing chamber and the thermal storage media entering the mixing chamber). Having a relatively large temperature grade between the gas and the thermal storage media may help increase the efficiency of the heat transfer between the gas and the thermal storage media As the first portion of the thermal storage media is warmed by the gas its temperature will increase, which will reduce temperature grade between the gas and the thermal storage media and may reduce the heat transfer efficiency of the thermal storage system 2120. Preferably, the first portion of the thermal storage media is then transferred out of the mixing chamber 2635 and into hot storage chamber 2610, and a fresh, second portion of the thermal storage media at the cold storage temperature can then be transferred into the mixing chamber 2635. This can then re-establish the relatively larger temperature grade between the gas and the thermal storage media and thereby increase the heat transfer efficiency of the thermal storage system 2120. Preferably, the gas stream flows through the mixing chamber 2635 in a generally continuous manner during the charging mode while the thermal storage media may be moved through the mixing chamber 2635 in a generally continuous manner or alternatively in an intermittent or batch manner. Optionally, the flow rate of the thermal storage media may be selected such that a sufficiently low approach temperature (temperature difference between the gas exiting the mixing chamber and thermal media entering the mixing chamber) is achieved. Optionally, the flow rate of thermal media may be selected such that the approach temperature is between 5° C. and 40° C. or between 10° C. and 20° C.

This embodiment of a thermal storage subsystem 2120 may also help facilitate heat transfer during a partial charging or discharging of the systems 10 described herein. Specifically, as only a relatively small portion of the thermal storage media is being mixed with the gas flow at a given time, if the system 10 is only partially charged at least some of the cold thermal storage media may remain "unused" within the cold storage chamber 2606 and need not enter the mixing chamber 2635 or be heated by the gas. That is, each portion of the cold thermal storage particles that is transferred from the cold storage chamber 2606 is preferably less than the total capacity of the cold storage chamber 2606 (and vice versa when operating in the discharge mode). This can help allow the portion of the thermal storage media that is heated to be heated to the desired storage temperature (which may help improve efficiency) rather than having the system configured to heat all of the thermal transfer media to a lower storage temperature (assuming a fixed amount of thermal energy is available to be transferred from the gas to the thermal storage media when in the charging mode). Similarly, if the system 10 is only partially discharged then at least some of the hot thermal storage media may remain stored within the hot storage chamber 2610 and need not be mixed with the gas exiting the accumulator 12. This can allow some of the hot thermal storage media to be held in reserve at its desired storage temperature to warm the next portion of gas drawn from the accumulator rather than the totality of the hot thermal storage media being partially cooled by exposure to a partial discharge gas flow.

When the system 10 is sufficiently charged it can be operated in its storage mode in which gas is neither flowing in to or out of the accumulator 12. In this mode, there need not be movement of the thermal storage media between the cold storage chamber 2606, hot storage chamber 2610 and mixing chamber 2635.

When the compressed gas energy storage system 10 is then operated in is discharging mode the process described above may be reversed. That is, for example i) granular heat transfer particles may be conveyed from the hot storage chamber 2610 into the first mixing chamber 2635, ii) thermal energy may be transferred from the granular heat transfer particles within the mixing chamber 2635 to the compressed gas stream being conveyed out of the accumulator 12 via the first mixing chamber 2635 thereby cooling the granular heat transfer particles and heating the compressed gas and iii) the cooled granular heat transfer particles may be conveyed from the first mixing chamber 2635 to the cold storage chamber 2606 for storage.

When operating in this manner, a first, smaller portion of hot thermal storage media is mixed with the relatively cool gas stream exiting the accumulator. This can help provide a relatively large temperature grade between the gas and the thermal storage media (i.e. a large difference in temperature between the gas entering the mixing chamber and the thermal storage media entering the mixing chamber). As the first portion of the thermal storage media is cooled by the gas its temperature will decrease, which will reduce temperature grade between the gas and the thermal storage media and may reduce the heat transfer efficiency of the thermal storage system 2120. Preferably, the first portion of the thermal storage media is then transferred out of the mixing chamber 2635 and into cold storage chamber 2610, and a fresh, second portion of the thermal storage media at the hot storage temperature can then be transferred into the mixing chamber 2635. Optionally, this transfer can be done in a continuous manner in which at least some of the first portion of the thermal storage particles remain in the mixing chamber 2635 as some of the second portion of cold thermal storage particles are introduced into the inlet 2810. This can then re-establish the relatively larger temperature grade between the gas and the thermal storage media and thereby increase the heat transfer efficiency of the thermal storage system 2120. Preferably, the gas stream flows through the mixing chamber 2635 in a generally continuous manner during the charging mode while the thermal storage media may be moved through the mixing chamber 2635 in a generally continuous manner or alternatively in an intermittent or batch manner. Optionally, the flow rate of the thermal storage media may be selected such that a sufficiently low approach temperature (temperature difference between the gas exiting the mixing chamber and thermal media entering the mixing chamber) is achieved. Optionally, the flow rate of thermal media may be selected such that the approach temperature is between 5° C. and 40° C. or between 10° C. and 20° C.

Referring again to FIGS. 9-11, in this embodiment of the thermal storage subsystem 2120 the first mixing chamber 2635 may be connected to the accumulator 12 and the compressor/expander subsystem 2100 by the gas flow path 2700 and may also be connected to the cold solid storage chamber 2606 and the hot solid storage chamber 2610 by a solid flow path 2800. By way of non-liming example, the solid flow path may include a conveyor system which may be configured to selectably move the solid thermal storage media from the cold solid storage chamber 2606, through the first mixing chamber 2635, into the hot solid storage chamber 2610 during charging phase, or to move the solid thermal storage media from the hot solid storage chamber 2610, through the first mixing chamber 2635, into the cold solid storage chamber 2606 during discharging phase.

FIG. 10A is a schematic view of a preferred arrangement of the components of the solid thermal storage media thermal storage subsystem 2120 of FIG. 9, showing the air flow and solid thermal media movement flows during a compression (charging) mode. In this mode, ambient air may be drawn in via gas inlet 2170 conveyed through the compressor/expander system 2100 and then into the interior of the mixing chamber 2635 through a gas inlet 2710 which is provided toward a lower end of the first mixing chamber 2635. In certain preferred embodiments the inlet gas pressure at 2710 may be about the same pressure as the desired pressurized gas in the accumulator 12.

At or around the same time that gas is being routed via the gas flow path 2700 to the first mixing chamber 2635 the granular thermal storage media is transferred from the cold storage chamber 2606 and is introduced into the interior of the mixing chamber 2635 via a particle inlet 2810, which may include one or more suitable inlet ports, that is preferably provided toward the upper end of the mixing chamber 2635 and preferably is above the gas inlet 2710. The thermal storage media can then fall downwardly through the mixing chamber 2635 in a first direction and can mix with the gas. In this embodiment, during the charging phase the gas travels generally upwardly and the thermal storage media travels generally downwardly within the mixing chamber 2635 (and may be considered to be in a counter-flow configuration). By way of non-limiting example, the solid thermal storage media at inlet 2810 may have a temperature of 10° C.-50° C.

Within the mixing chamber 2635 the relatively cooler solid thermal storage media from the cold storage chamber 2606 may move by gravity from the top of the first mixing chamber 2635 to the bottom of the first mixing chamber, directly contacting the gas travelling through the mixing chamber 2635 such that the gas transfers any excess heat to the cold solid thermal storage media. The resulting warmer solid thermal storage media will be removed from the mixing chamber 2635 via a particle outlet 2820, which may include one or more ports, and the relatively cooler gas can exit via a gas outlet 2720. The warmed thermal storage media may then be transferred to the hot storage chamber 2610. By way of non-limiting example, the solid thermal storage media at outlet 2820 may have a temperature of 150° C.-350° C.

In certain preferred embodiments, one or both of the particle inlet 2810 and particle outlet 2820 may include any suitable pressure regulating apparatus that can allow the solid thermal heat transfer media to be transferred into and out of the mixing chamber 2635 without allowing the relatively higher-pressure gas to escape from the mixing chamber 2635. This may help to maintain the desired pressure within the first mixing chamber 2635. By way of non-limiting example, the pressure regulating apparatuses 2910 and 2920 are provided at the particle inlet 2810 and outlet 2820, respectively, and may be of any suitable configuration and may include a multi chamber airlock device, double-dump air lock, double flap airflow, educator, rotary valves a rotary system, a high-pressure vacuum system. a peristaltic pump and the like. The pressure regulating apparatuses 2910 and 2920 may be the same or may be different.

Gas exiting the first mixing chamber 2635 via its gas outlet 2720 will have specific set of gas outlet conditions such that the outlet gas pressure is about the same pressure as the desired pressurized gas in the accumulator 12 or the desired inlet pressure as the next stage of compression (for embodiments where there is more than one stage of compression), and the gas outlet temperature at 2720 is lower than the gas inlet temperature at inlet 2710. The temperature drop in the gas in a given embodiment may depend on a variety of factors including 1) the number of stages of compression, with larger temperature drops generally utilized when using fewer compression stages; and 2) the accumulator pressure (i.e. accumulator depth), with a larger temperature drop generally utilized for a higher accumulator pressure. For example, for a 2-compression embodiment a temperature drop of 250° C.-350° C. may be utilized, while for a 3-compression embodiment at a temperature drop of 125° C. to 200° C. per stage may be utilized. Gas exiting the first mixing chamber 2635 may then be conveyed to the accumulator 12.

In certain embodiments, that thermal storage subsystem 2120 may include a plurality of mixing chambers, each with an associated compression/expansion stage. In said embodiments, each mixing chamber may be arranged in series, such that during the charging phase, gas may be compressed through a first compressor to a first mixing chamber, then further compressed through a second compressor to a second mixing chamber and so on, wherein the gas transfers heat to a relatively cold solid thermal storage media in each consecutive mixing chamber until the gas exiting the final mixing chamber is transferred to the accumulator 12.

FIG. 11 is a schematic view of components of the solid thermal storage media thermal storage subsystem 2120 of FIG. 9, showing airflow during an expansion (discharging) mode. In this mode, compressed air may be conveyed from the accumulator 12 via a gas inlet 2730 that is located toward the lower end of the first mixing chamber 2635. The gas inlet 2730 may be the same port that functions as the gas outlet 2720 when in the charging mode or may be separate. In certain preferred embodiments the inlet gas pressure at 2730 may be about the same pressure as the desired pressurized gas in the accumulator 12. Gas exiting the first mixing chamber 2635 may then be expanded through the first expander of compressor and expansion system 2100 such that the gas exiting the compressor and expansion system 2100 is about atmospheric pressure. The gas exiting the compressor and expansion system 2100 may then be transferred to the atmosphere.

The gas outlet 2740 may be the same port that functions as the gas inlet 2710 when in the charging mode or may be separate.

At or around the same time that gas is being routed from the accumulator 12 to the bottom of the first mixing chamber 2635 and withdrawn from the upper end of the mixing chamber 2635, the hot solid thermal storage media may be conveyed along the solid flow path 2800 and into the particle inlet 2810 which is located toward the upper end of the mixing chamber 2635. This allows the hot thermal storage particles to fall downwardly through the mixing chamber 2635 via gravity, and to travel in the opposite direction as the thermal storage particle travel during the charging mode. In this arrangement the gas and thermal storage particles travel through the mixing chamber 2635 in opposite directions (and may be in a counter-flow arrangement).

FIG. 10B is a schematic view of an alternative arrangement of the components of the solid thermal storage media thermal storage subsystem 2120 of FIG. 9, showing the air flow and solid thermal media movement flows during a compression (charging) mode. In this mode, ambient air may be drawn in via gas inlet 2170 conveyed through the compressor/expander system 2100 and then into the interior of the mixing chamber 2635 through a gas inlet 2710 which is provided toward an upper end of the first mixing chamber 2635. In certain preferred embodiments the inlet gas pressure at 2710 may be about the same pressure as the desired pressurized gas in the accumulator 12.

At or around the same time that gas is being routed via the gas flow path 2700 to the first mixing chamber 2635 the granular thermal storage media is transferred from the cold storage chamber 2606 and is introduced into the interior of the mixing chamber 2635 via a particle inlet 2810, which may include one or more suitable inlet ports, that is preferably provided toward the upper end of the mixing chamber 2635 and preferably is above the gas inlet 2710. The thermal storage media can then fall downwardly through the mixing chamber 2635 in a first direction and can mix with the gas. In this embodiment, during the charging phase the gas travels generally downwardly and the thermal storage media also travels generally downwardly within the mixing chamber 2635 (and may be considered to be in a co-flow configuration). By way of non-limiting example, the solid thermal storage media at inlet 2810 may have a temperature of 10° C.-50° C.

Within the mixing chamber 2635 the relatively cooler solid thermal storage media from the cold storage chamber 2606 may move by gravity from the top of the first mixing chamber 2635 to the bottom of the first mixing chamber, directly contacting the gas travelling through the mixing chamber 2635 such that the gas transfers any excess heat to the cold solid thermal storage media. The resulting warmer solid thermal storage media will be removed from the mixing chamber 2635 via a particle outlet 2820, which may include one or more ports, and the relatively cooler gas can exit via a gas outlet 2720. The warmed thermal storage media may then be transferred to the hot storage chamber 2610. By way of non-limiting example, the solid thermal storage media at outlet 2820 may have a temperature of 150° C.-350° C.

In certain preferred embodiments, one or both of the particle inlet 2810 and particle outlet 2820 may include any suitable pressure regulating apparatus that can allow the solid thermal heat transfer media to be transferred into and out of the mixing chamber 2635 without allowing the relatively higher-pressure gas to escape from the mixing chamber 2635. This may help to maintain the desired pressure within the first mixing chamber 2635. By way of non-limiting example, the pressure regulating apparatuses 2910 and 2920 are provided at the particle inlet 2810 and outlet 2820, respectively, and may be of any suitable configuration and may include a multi chamber airlock device, double-dump air lock, double flap airflow, educator, rotary valves a rotary system, a high-pressure vacuum system and the like. The pressure regulating apparatuses 2910 and 2920 may be the same or may be different.

Gas exiting the first mixing chamber 2635 via its gas outlet 2720 will have specific set of gas outlet conditions such that the outlet gas pressure is about the same pressure as the desired pressurized gas in the accumulator 12 or the desired inlet pressure as the next stage of compression (for embodiments where there is more than one stage of compression), and the gas outlet temperature at 2720 is lower than the gas inlet temperature at inlet 2710. The temperature drop in the gas in a given embodiment may depend on a variety of factors including 1) the number of stages of compression, with larger temperature drops generally utilized when using fewer compression stages; and 2) the accumulator pressure (i.e. accumulator depth), with a larger temperature drop generally utilized for a higher accumulator pressure. For example, for a 2-compression embodiment a temperature drop of 250° C.-350° C. may be utilized, while for a 3-compression embodiment at a temperature drop of 125° C. to 200° C. per stage may be utilized. Gas exiting the first mixing chamber 2635 may then be conveyed to the accumulator 12.

In certain embodiments, that thermal storage subsystem 2120 may include a plurality of mixing chambers, each with an associated compression/expansion stage. In said embodiments, each mixing chamber may be arranged in series, such that during the charging phase, gas may be compressed through a first compressor to a first mixing chamber, then further compressed through a second compressor to a second mixing chamber and so on, wherein the gas transfers heat to a relatively cold solid thermal storage media in each consecutive mixing chamber until the gas exiting the final mixing chamber is transferred to the accumulator 12.

In certain embodiments, that thermal storage subsystem 2120 may include a plurality of mixing chambers, each with an associated expander or stage of expansion. In said embodiments, each mixing chamber may be arranged in series, such that during the discharging phase, gas may be expander through a first expander to a first mixing chamber, then further expanded through a second expander to a second mixing chamber and so on, wherein the thermal storage media transfers heat to a relatively cold gas in each consecutive mixing chamber until the gas exiting the final mixing chamber is transferred to the final expander, and wherein gas exiting the last expander in the series of expanders is at or around atmospheric pressure.

In certain embodiments, the mixing chambers which are used during charging are preferably the same as the mixing chambers which are used during discharging. For these embodiments it is preferable to have the same number of compression stages as expansion stages.

What has been described above has been intended to be illustrative of the invention and non-limiting and it will be understood by persons skilled in the art that other variants and modifications may be made without departing from the scope of the invention as defined in the claims appended hereto.

We claim:

1. A compressed air energy storage system comprising:
   a) a container configured to contain compressed gas at a storage pressure;
   b) a gas compressor/expander subsystem comprising at least a first compression stage having a first gas inlet and a gas outlet in fluid communication with the container via a gas flow path for conveying compressed gas at the storage pressure to the container when in a charging mode and from the container when in a discharging mode;
   c) a thermal storage subsystem comprising:
      i) a cold storage chamber for containing a supply of granular heat transfer particles at a cold temperature and cold storage pressure;
      ii) a hot storage chamber for containing the supply of granular heat transfer particles at a hot temperature and hot storage pressure;
      iii) at least a first mixing chamber in the gas flow path and having an interior in which the compressed gas contacts the granular heat transfer particles at a mixing pressure that is greater than the cold storage pressure and the hot storage pressure;
      iv) a conveying system operable to selectably move the granular heat transfer particles from the cold storage chamber, through the first mixing chamber and into the hot storage chamber, and vice versa;
   wherein:
      when the compressed air energy storage system is in the charging mode i) granular heat transfer particles are conveyed from the cold storage chamber into the first mixing chamber, ii) thermal energy is transferred to the granular heat transfer particles within the first mixing chamber from the compressed gas stream being conveyed into the container via the first mixing chamber thereby heating the granular heat transfer particles and cooling the compressed gas, and iii) the heated granular heat transfer particles are conveyed from the first mixing chamber toward the hot storage chamber for storage and the cooled compressed stream is conveyed from the first mixing chamber toward the container for storage; and when the compressed gas energy storage system is in the discharging mode i) granular heat transfer particles are conveyed from the hot storage chamber into the first mixing chamber, ii) thermal energy is transferred from the granular heat transfer particles within the first mixing chamber to the compressed gas stream being conveyed out of the container via the first mixing chamber thereby cooling the granular heat transfer particles and heating the compressed gas and iii) the cooled granular heat transfer particles are conveyed from the first mixing chamber toward the cold storage chamber for storage and the heated compressed stream is conveyed from the first mixing chamber toward the compressor/expander subsystem for expansion.

2. The compressed air energy storage system of claim 1, wherein the mixing pressure is substantially the same as the storage pressure and wherein the hot storage chamber is spaced apart from and fluidly isolated from the cold storage chamber.

3. The compressed air energy storage system of claim 1, wherein the first mixing chamber has
   d) a gas inlet by which compressed gas can enter the first mixing chamber,
   e) a gas outlet by which compressed gas can exit the first mixing chamber,
   f) a particle inlet by which the granular heat transfer particles can enter the first mixing chamber;
   g) a particle outlet by which the granular heat transfer particles can exit the first mixing chamber and
   wherein the conveying system comprises an inlet airlock at the particle inlet that is operable to permit passage of the granular heat transfer particles at the cold or hot storage temperature into the first mixing chamber interior while substantially maintaining the interior at the mixing pressure.

4. The compressed air energy storage system of claim 3, wherein the conveying system comprises an outlet airlock at the particle outlet that is operable to permit passage of the granular heat transfer particles at the cold or hot storage temperature out of the first mixing chamber interior while substantially maintaining the interior at the mixing pressure and wherein the mixing chamber is configured in a counter-flow arrangement in which the granular heat transfer particles move from the particle inlet to the particle outlet in a first flow direction and the compressed gas moves from the gas inlet to the gas outlet in a generally opposing, second flow direction.

5. The compressed air energy storage system of claim 1, wherein the granular heat transfer particles are conveyed in a generally continuous flow manner between the cold storage tank and hot storage tank when the system is the charging or discharging mode (as compared to a batch process).

6. The compressed air energy storage system of claim 1, wherein the granular heat transfer particles are conveyed in a generally batch process between the cold storage tank and hot storage tank when the system is the charging or discharging mode.

7. The compressed air energy storage system of claim 1, wherein the mixing pressure is greater than atmospheric pressure and is substantially equal to the storage pressure.

8. The compressed air energy storage system of claim 1, wherein the hot storage chamber is at a lower pressure than the first mixing chamber.

9. The compressed air energy storage system of claim 1, wherein the hot storage pressure is less than about 10% of the storage pressure.

10. The compressed air energy storage system of claim 1, wherein the hot storage chamber is at substantially atmospheric pressure.

11. The compressed air energy storage system of claim 1, wherein the cold storage chamber is at a lower pressure than the mixing chamber.

12. The compressed air energy storage system of claim 1, wherein the cold storage pressure is less than about 10% of the storage pressure.

13. The compressed air energy storage system of claim 1, wherein the cold storage chamber is at substantially the same pressure as the hot storage chamber.

14. The compressed air energy storage system of claim 1, wherein a capacity of the cold storage chamber is greater than a capacity of the first mixing chamber.

15. A method of temporarily storing thermal energy via a thermal storage subsystem in a compressed air energy storage system comprising a container configured to contain compressed gas at a storage pressure and a gas compressor/expander subsystem comprising at least a first compression stage having a first gas inlet and a gas outlet in fluid communication with the container via a gas flow path for conveying compressed gas to the container when in a charging mode and from the container when in a discharging mode, the method comprising:
   h) during the charging mode:
      i) conveying a first portion of cold granular heat transfer particles from a cold storage chamber into an interior of a mixing chamber;
      ii) contacting the first portion of cold granular heat transfer particles in the interior with the compressed gas traveling from the gas compressor/expander subsystem into the container, thereby transferring thermal energy from the compressed gas to the first portion of cold granular heat transfer particles thereby providing a first portion of warmed granular heat transfer particles;
      iii) conveying the first portion of warmed granular heat transfer particles from the interior of the mixing chamber into a hot storage chamber;
      iv) conveying a second portion of cold granular heat transfer particles from the cold storage chamber into the interior of the mixing chamber;
      v) contacting the second portion of cold granular heat transfer particles in the interior with the compressed gas traveling from the gas compressor/expander subsystem into the container, thereby transferring thermal energy from the compressed gas to the second portion of cold granular heat transfer particles and providing a second portion of warmed granular heat transfer particles;
      vi) conveying the second portion of warmed granular heat transfer particles from the interior of the mixing chamber into a hot storage chamber.

16. The method of claim 15, wherein the first portion of cold granular heat transfer particles comprises only a portion of the total quantity of cold granular heat transfer particles contained in the cold storage chamber.

17. The method of claim 15, wherein steps i) to vi) are conducted in a generally continuous manner whereby at least some of the first portion of cold granular heat transfer particles is in the mixing chamber at the same time as the second portion of cold granular heat transfer particles is introduced into the mixing chamber.

18. The method of claim 15, further comprising only partially charging the container wherein the first portion of warmed granular heat transfer particles and second portion of warmed granular heat transfer particles are stored within the hot storage chamber and wherein a third portion of cold granular heat transfer particles remains within the cold storage chamber and does not enter the mixing chamber.

19. The method of claim 15, wherein after steps i) to vi) have been completed a third portion of cold granular heat transfer particles remains within the cold storage chamber.

20. The method of claim 15, wherein at least some of the first portion of warmed granular heat transfer particles.

* * * * *